United States Patent
Twiss

(10) Patent No.: US 12,501,585 B2
(45) Date of Patent: Dec. 16, 2025

(54) CONTROLLED-FORCE THERMAL MANAGEMENT DEVICE INSTALLATION

(71) Applicant: Cisco Technology, Inc., San Jose, CA (US)

(72) Inventor: Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 628 days.

(21) Appl. No.: 17/826,864

(22) Filed: May 27, 2022

(65) Prior Publication Data
US 2023/0129211 A1    Apr. 27, 2023

Related U.S. Application Data

(60) Provisional application No. 63/270,116, filed on Oct. 21, 2021.

(51) Int. Cl.
H05K 7/20 (2006.01)
G05D 15/00 (2006.01)
H01L 23/40 (2006.01)
H05K 13/08 (2006.01)

(52) U.S. Cl.
CPC ......... *H05K 7/20418* (2013.01); *G05D 15/00* (2013.01); *H01L 23/40* (2013.01); *H01L 23/4006* (2013.01); *H05K 7/205* (2013.01); *H05K 13/0882* (2018.08); *H01L 2023/4081* (2013.01); *H01L 2023/4087* (2013.01)

(58) Field of Classification Search
CPC ............ G05D 15/00; H01L 2023/4081; H01L 2023/4087; H01L 23/40; H01L 23/4006; H05K 13/0882; H05K 7/20418; H05K 7/205

See application file for complete search history.

(56) References Cited

U.S. PATENT DOCUMENTS

| 11,071,195 | B1 | 7/2021 | Tong |
| 2004/0088853 | A1* | 5/2004 | Cromwell ........... H01L 23/4006 257/E23.084 |
| 2006/0215383 | A1 | 9/2006 | Unrein |
| 2007/0035937 | A1 | 2/2007 | Colbert et al. |

(Continued)

FOREIGN PATENT DOCUMENTS

WO    2005124931 A1    12/2005

OTHER PUBLICATIONS

Kryotherm, "Thermoelectric Generating Modules," https://www.amstechnologies-webshop.com/media/pdf/0b/be/d0/Thermoelectric-Peltier-Generator-Modules-Kryotherm-Overview.pdf, Apr. 2019, 4 pages.

*Primary Examiner* — Minh N Trinh
(74) *Attorney, Agent, or Firm* — Edell, Shapiro & Finnan, LLC

(57) ABSTRACT

Systems and methods for controlled-force thermal management device installation that helps thermal management of emerging, next-generation devices are provided. A system includes a mounting assembly for a thermal management device. The mounting assembly includes a fastener and a coupler. The system further includes a compression and locking interface configured to lock with the coupler and compress the mounting assembly to a predetermined loading point using a controlled force. The fastener is installed when the mounting assembly is at the predetermined loading point.

23 Claims, 21 Drawing Sheets

(56) References Cited

U.S. PATENT DOCUMENTS

| | | |
|---|---|---|
| 2007/0241449 A1 | 10/2007 | Colbert et al. |
| 2008/0264603 A1 | 10/2008 | Colbert et al. |
| 2008/0266808 A1 | 10/2008 | Aberg et al. |
| 2009/0083972 A1 | 4/2009 | Colbert et al. |
| 2010/0226102 A1* | 9/2010 | So .................. H05K 1/0204 361/748 |
| 2011/0038125 A1* | 2/2011 | Cao ................ H01L 23/4006 361/720 |
| 2021/0183738 A1 | 6/2021 | Tong |
| 2023/0129211 A1* | 4/2023 | Twiss ............. H05K 13/0882 361/709 |

* cited by examiner

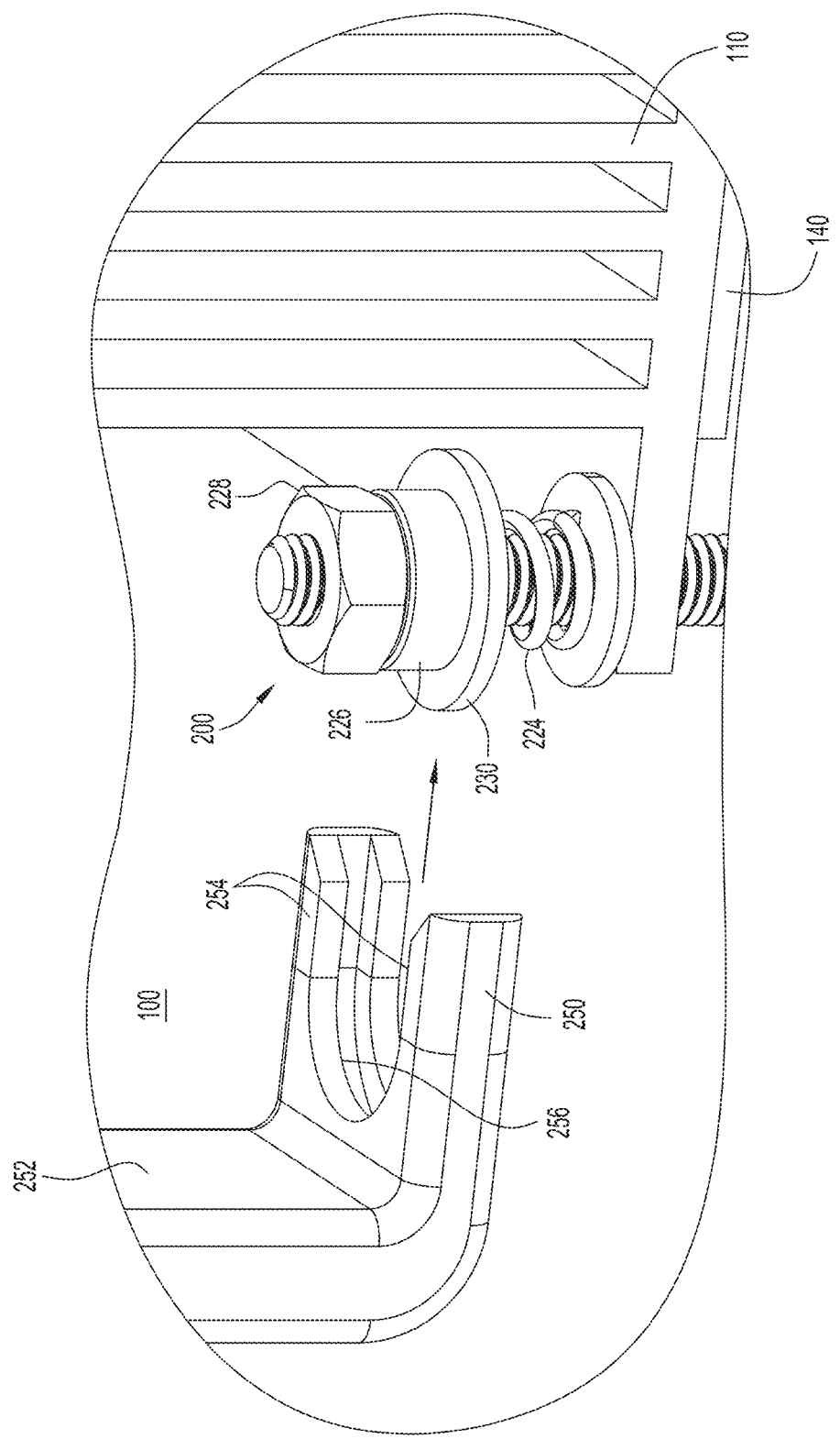

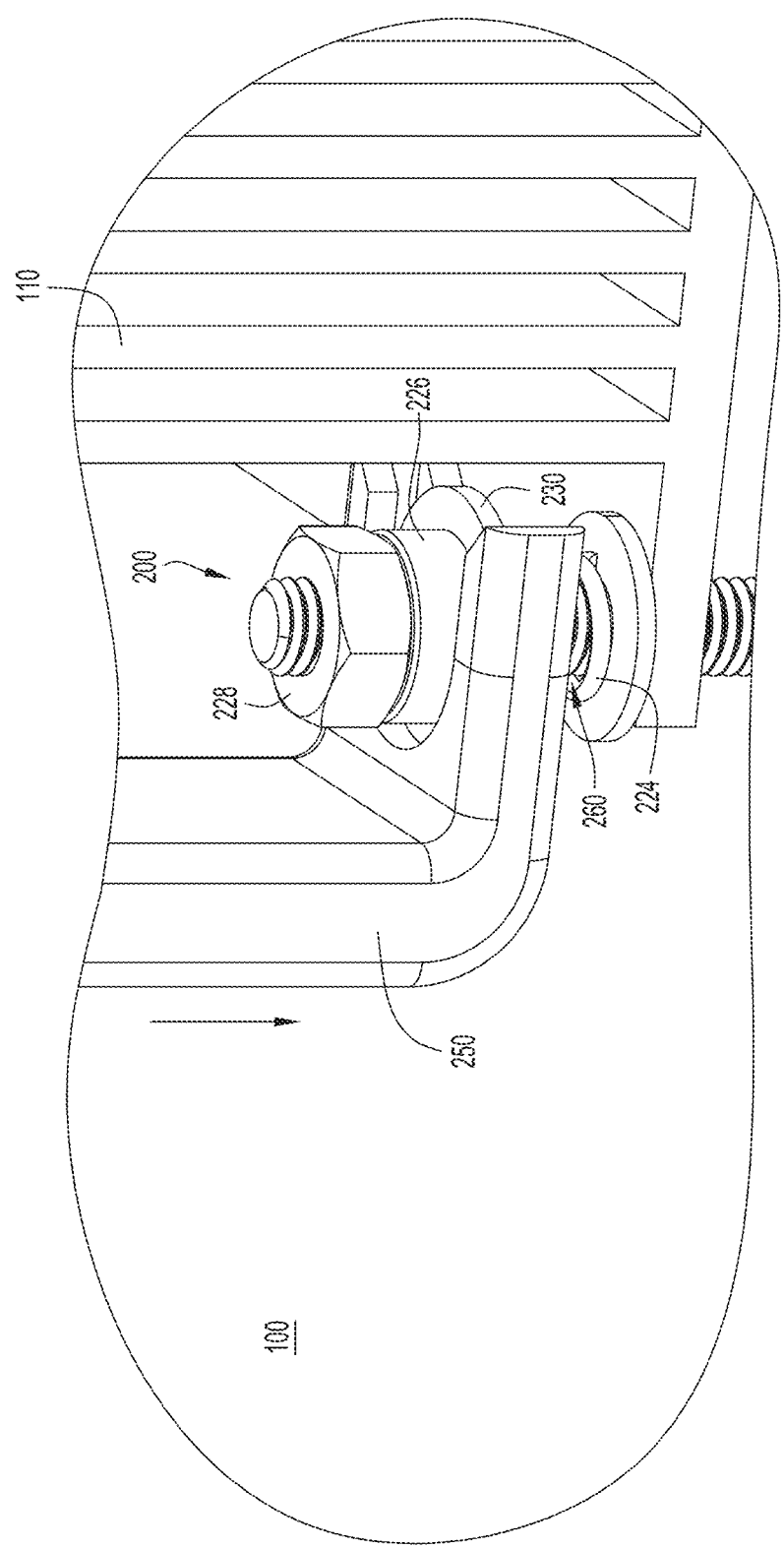

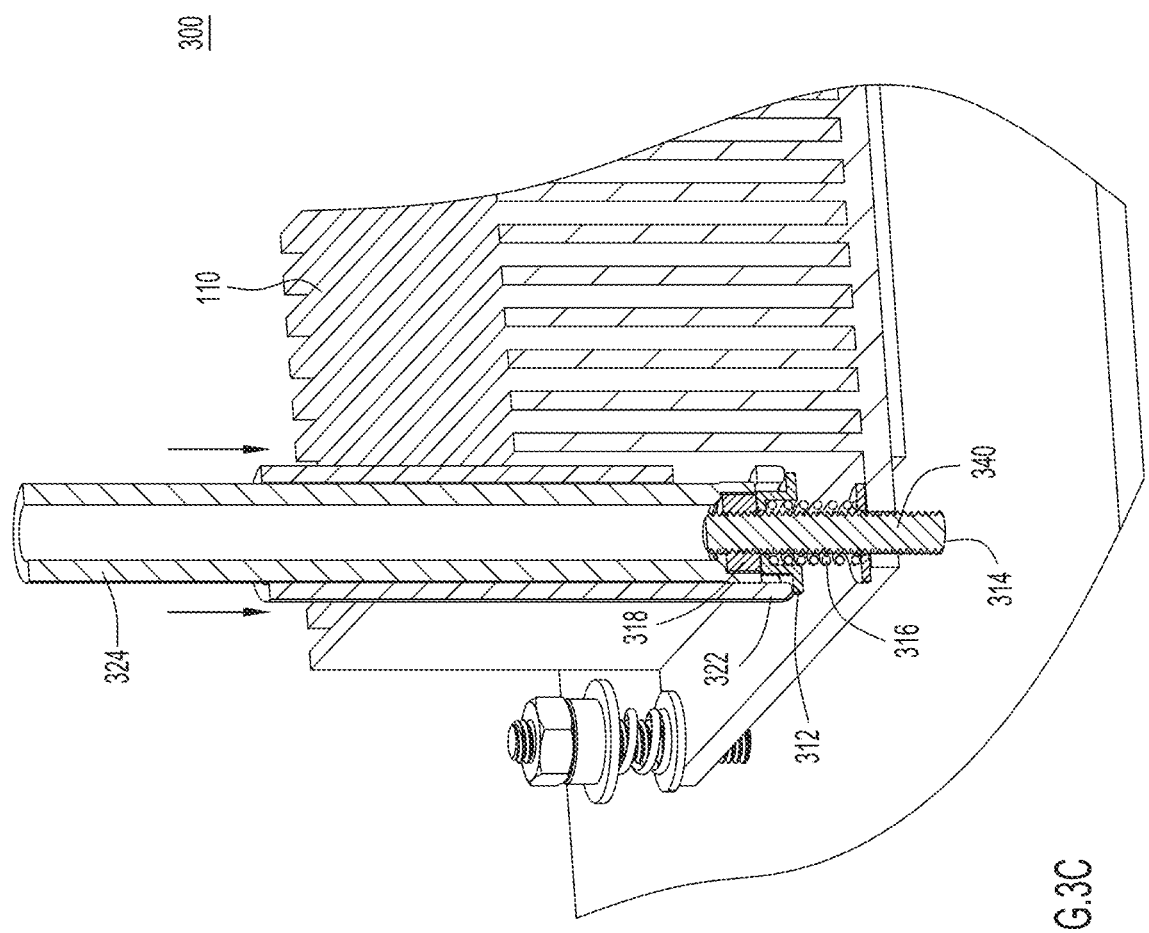

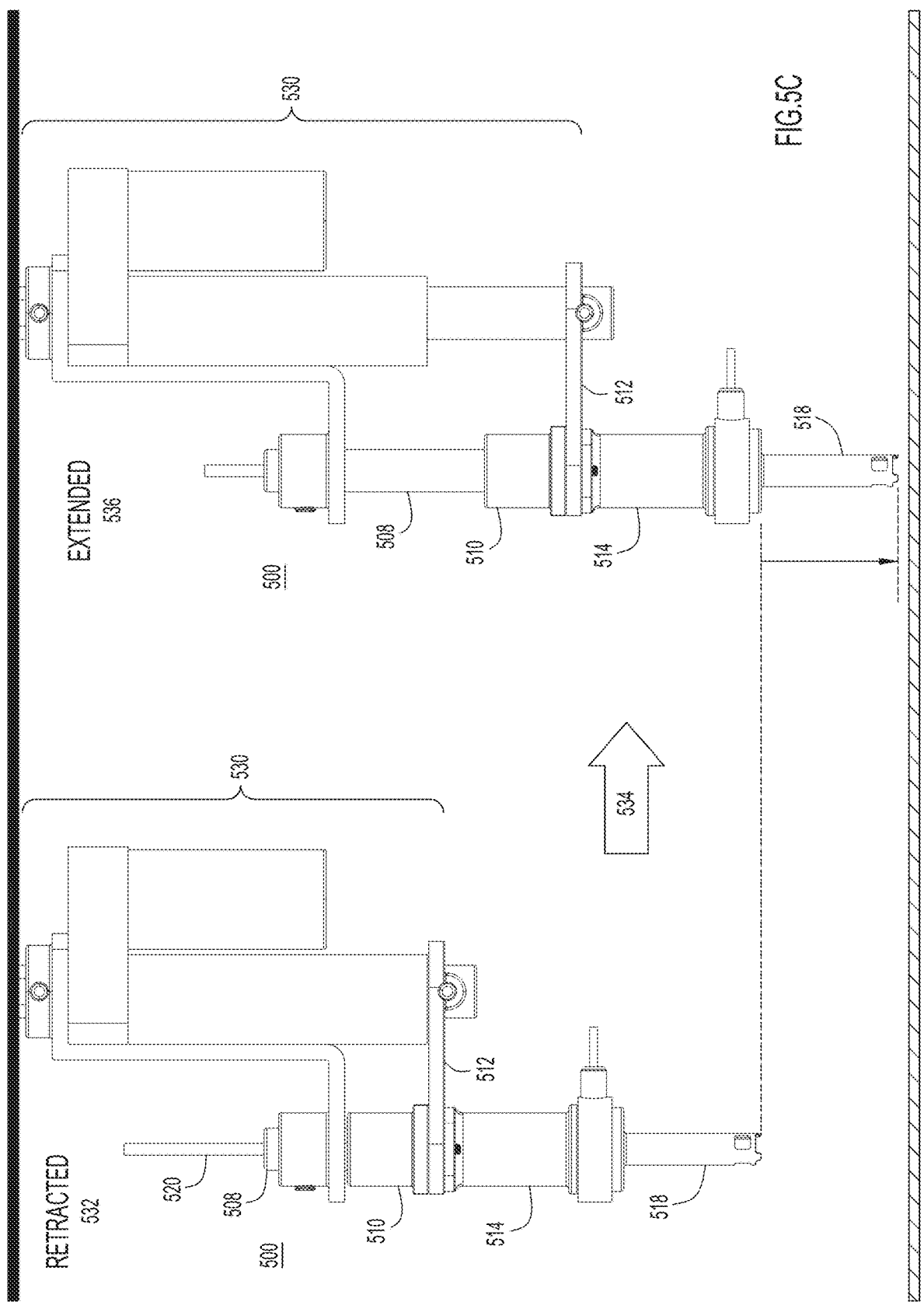

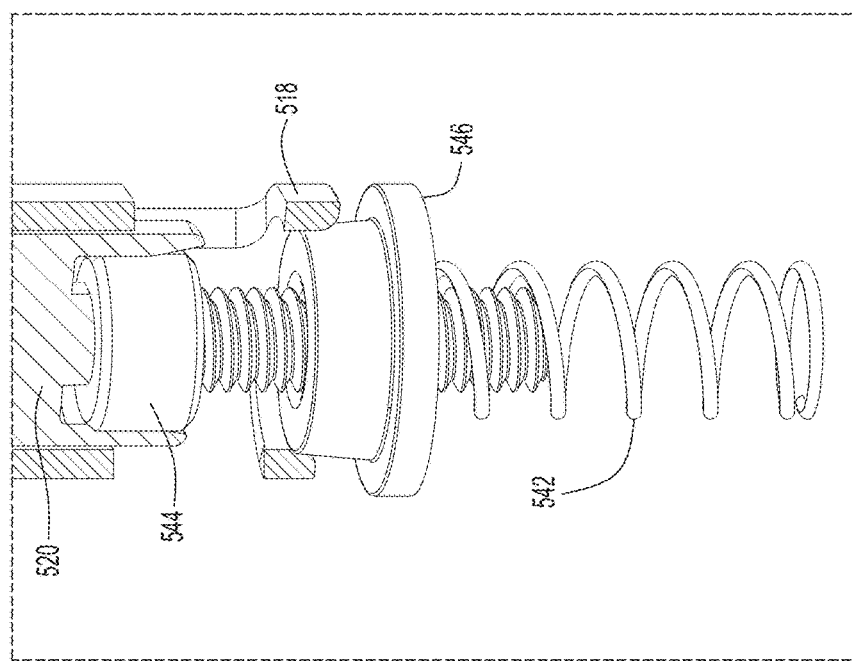
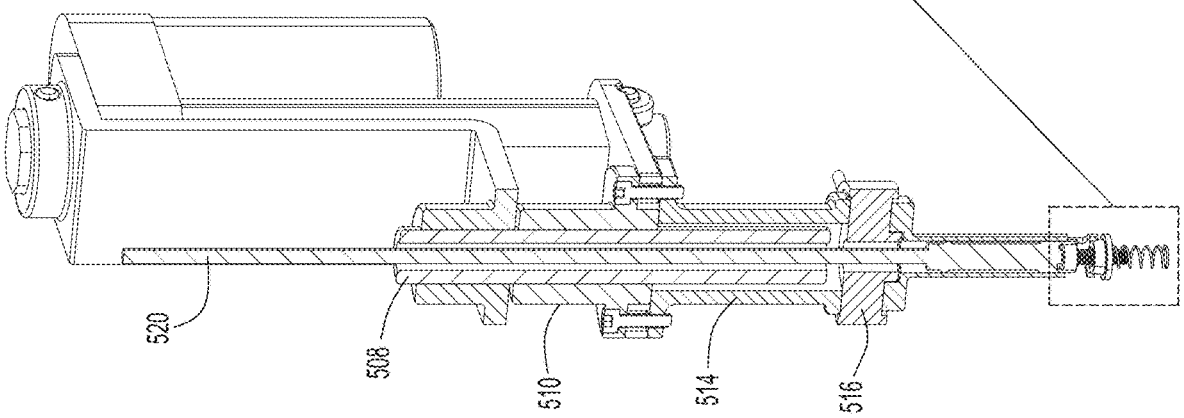
FIG.5D

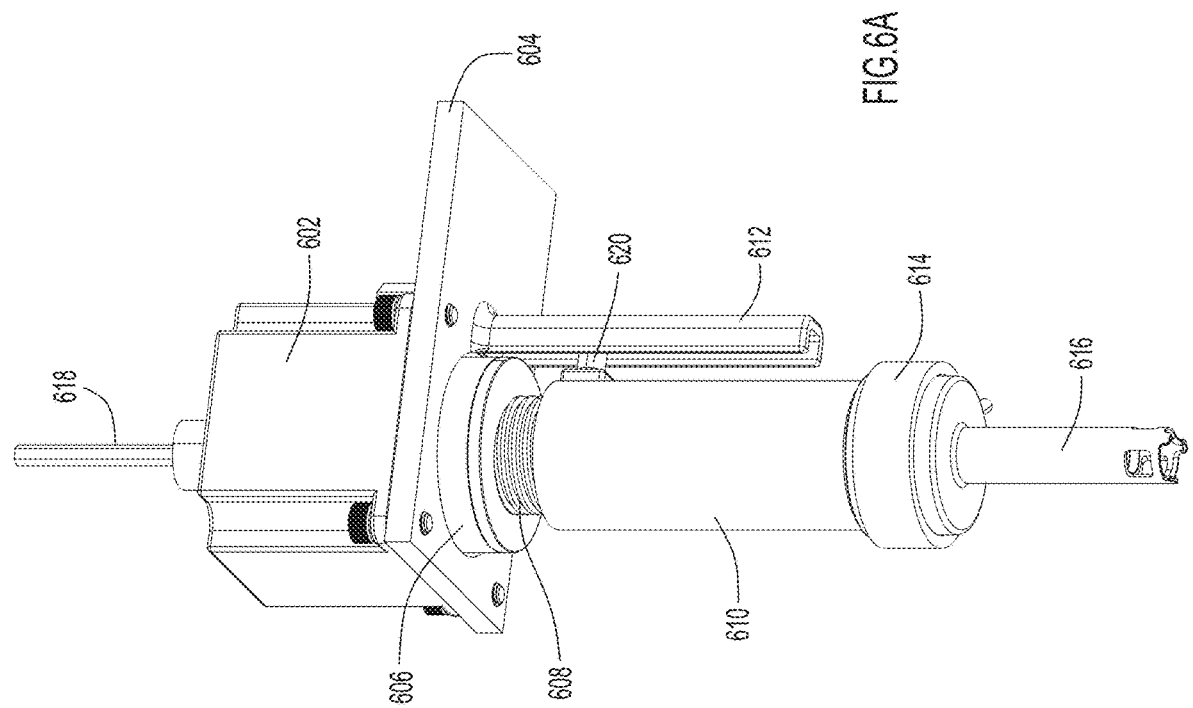

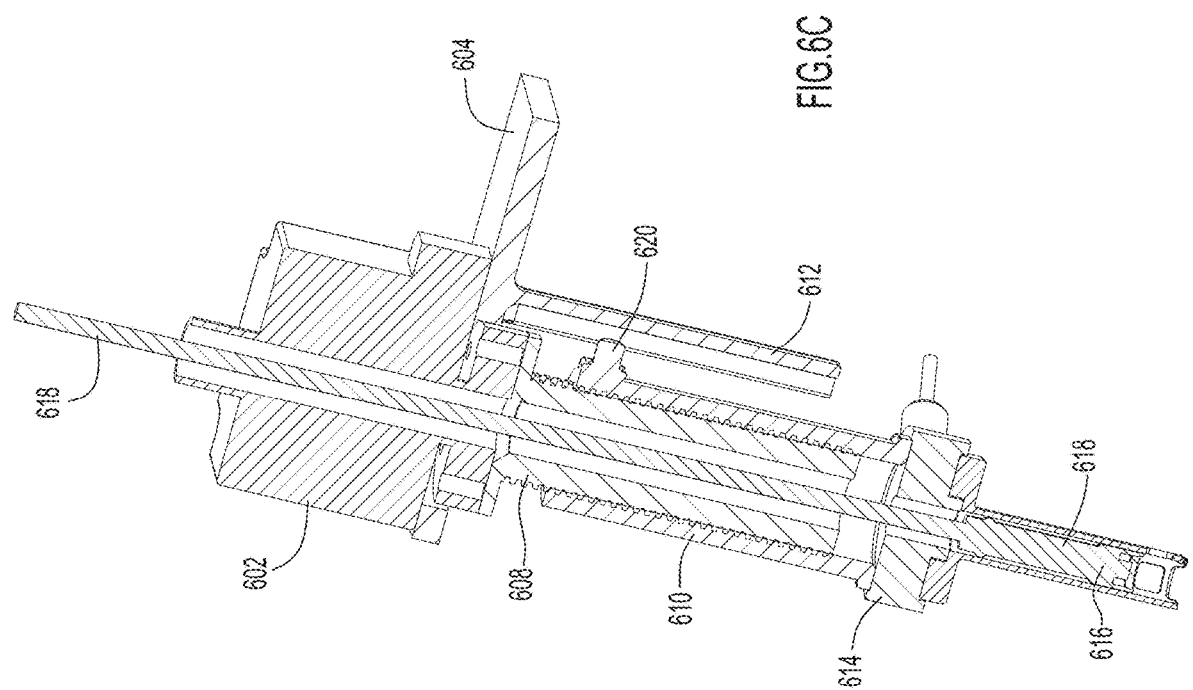

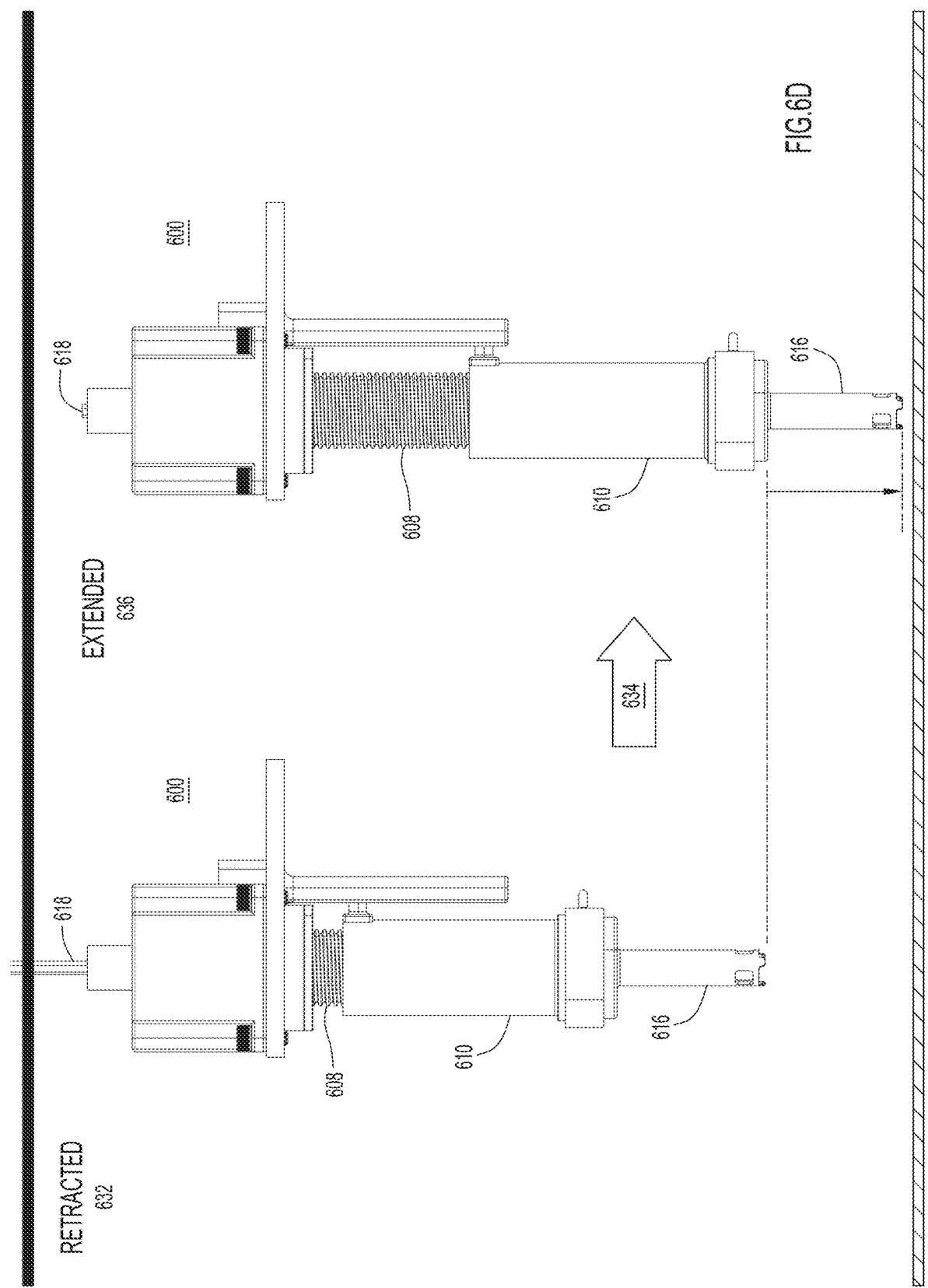

CONTROLLED-FORCE THERMAL MANAGEMENT DEVICE INSTALLATION

CROSS-REFERENCE TO RELATED APPLICATION(S)

This application claims the benefit of priority to U.S. Provisional Patent Application No. 63/270,116, filed Oct. 21, 2021, the content of which is incorporated herein by reference in its entirety.

TECHNICAL FIELD

The present disclosure relates to a thermal management device installation, such as for a heatsink, and in particular, an apparatus and method for mounting a thermal management device onto a silicon device.

BACKGROUND

With the rapid increase of silicon device total power, power density, and the presence of irregular thermal "hotspots" due to chip internal layout, implementing sufficient thermal management methods will continue to be an increasingly difficult challenge that will only become more acute over time. A variety of thermal management devices (TMDs) including heatsinks, heat pipes, thermal siphons, and liquid-cooling combinations are employed to remove, redirect, and dispose of increasing thermal energy loads. Additionally, various thermal interface materials (TIMs) are being developed to help "gap fill" and reduce thermal impedance between silicon devices and TMD components.

BRIEF DESCRIPTION OF THE DRAWINGS

FIG. 2B is a side view of a system before the compression and locking interface is engaged with the TFCMA, according to an example embodiment.

FIG. 2C is a side view of a system showing the compression and locking interface engaged with the TFCMA, according to an example embodiment.

FIG. 3C is a part perspective and part cross-sectional view of the system having the collinear compression and locking interface engage the embedded mounting assembly, according to another example embodiment.

FIG. 5C illustrates the system of FIG. 5A transitioning from the retracted state to the extended state, according to another example embodiment.

FIG. 5D is a part perspective and part cross-sectional view of the system of FIG. 5A, according to another example embodiment.

FIG. 6A is a perspective view of a system with a collinear driving mechanism driving a compression and locking interface, according to yet another example embodiment.

FIG. 6C is a cross-section view of the system of FIG. 6A, according to another example embodiment.

FIG. 6D is a diagram of the system of FIG. 6A transitioning from a retracted state to an extended state, according to another example embodiment.

DESCRIPTION OF EXAMPLE EMBODIMENTS

Overview

Figure 1A:
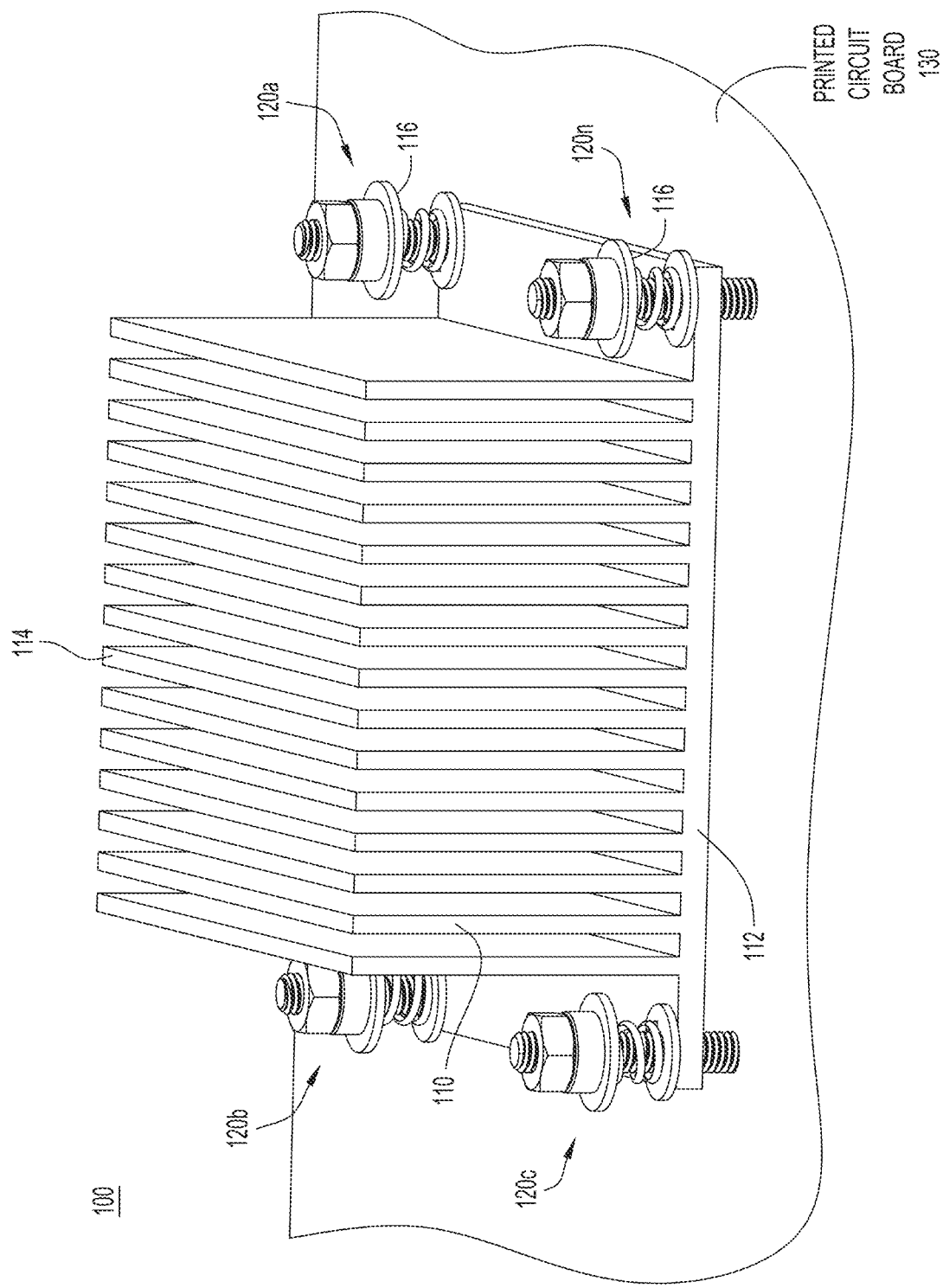
FIG. 1A is a top view of a system having a thermal management device (TMD) installed onto a printed circuit board (PCB) using TMD force-control mounting assemblies (TFCMAs), according to an example embodiment.

Presented herein are systems and methods for controlled-force TMD installation that helps thermal management of emerging, next-generation devices. In addition, the systems and methods provide a future-proof platform that is readily programmable and adaptable to a wide-range of system architectures and specific applications.

In one form, a system for installing a thermal management device is provided. The system includes a mounting assembly for the thermal management device. The mounting assembly includes a fastener and a coupler. The system further includes a compression and locking interface configured to lock with the coupler and compress the mounting assembly to a predetermined loading point using a controlled force. The fastener is then installed when the mounting assembly is at the predetermined loading point.

In another form, a method of mounting a thermal management device to a printed circuit board is provided. The method involves a programmable controller setting a target mounting force associated with a mounting force applied to a mounting assembly that mounts the thermal management device to a printed circuit board. The method further involves the programmable controller generating one or more commands, based on a feedback of a current mounting force applied to the mounting assembly. The method further involves compressing, based on the one or more commands, the mounting assembly with a driving mechanism that applies a continuous controlled force until the mounting assembly reaches the target mounting force and securing the thermal management device to the printed circuit board using the mounting assembly when the target mounting force is reached.

In yet another form, a system for driving the mounting assembly with a predetermined compression force to the target mounting force is provided. The system includes a programmable controller configured to generate one or more commands to control an installation of a thermal management device and a mounting assembly configured to fasten the thermal management device to another component of a device at a target mounting force. The system further includes a driving mechanism configured to drive the mounting assembly to the target mounting force, based on the one or more commands, using a predetermined compression force.

Example Embodiments

Various devices require cooling. For example, network devices, server computer systems, etc., include multiple semiconductor chips. TMDs, such as heatsinks, are used to dissipate thermal energy generated by these chips. Effective thermal management and reducing thermal impedance between components of the TMD and silicon devices can be challenging. Some designs of silicon device packages are "lidless" to further decrease overall thermal impedance by removing multiple interfaces within the TMD/TIM "stack". Though reducing the thermal stack with a lidless approach has many advantages, it also introduces several challenges, including stringent limitations on overall TMD mounting forces and co-planarity with the silicon devices to be cooled.

Based on different pressure requirements for various types of semiconductor chips, there are different ways in which the heatsinks may be installed, including, for example, the use of thermal epoxies, Z-clips, pushpins, and spring screws. For some chips (e.g., graphical processing unit (GPU) or central processing unit (CPU)), a threaded, spring-loaded fastener is used for a heatsink installation. That is, TMDs are mounted to silicon devices/components using spring-loaded fasteners that screw into the surrounding printed-circuit board (PCB) material and/or rigid mounting plates. Tightening and loosening the mounting screws allows some measure of control over the overall TMD mounting force exerted on the silicon device. TMD assembly forces are inferred through limiting torque settings on mounting screw-spring combinations. This, however, is not sufficiently accurate because of high variability in torque wrench setting repeatability. Further, the inferred torque-applied force is confounded by a combination of both the compression spring force and screw thread friction. Thus, specifying accurate and repeatable assembly force is extremely difficult, if not impossible. In addition, it is not possible to independently verify what final assembly force has occurred during assembly, making defect analyses and diagnoses extremely difficult should system performance problems occur post-assembly.

Some assembly techniques involve using a "constant height" fastener reliant on compression springs that are characterized and sorted based on similar spring-rate (i.e., force-deflection) characteristics. That is, individual springs are evaluated for spring-constant performance and then sorted and grouped into "+5%" or "−10%" etc. bins. During assembly, springs are then grouped with other springs from the same "performance family". This is intended to equalize spring forces and thereby, attempts to control TMD tilt and resultant gaps. However, this assembly technique cannot precisely control the overall assembly force. This assembly technique essentially forces precision on a mechanical device that is inherently imprecise, at the cost of ongoing logistics issues.

Moreover, poorly controlled or unequal mounting forces may cause gaps between the TMD and silicon components leading to, at best, poor performance, and, at worst, thermal runaway conditions that can destroy the silicon device. In addition, while silicon possesses relatively high compressive strength, it responds poorly to shear and tensile forces, and can become brittle leading to cracking due to unequal mounting and loading forces and excessive co-planarity mismatches. In both cases, the results of poorly controlled TMD mounting forces may not be seen immediately, and only become apparent later as a network problem or an in the field system failure requiring a costly Return Merchandise Authorization (RMA) case. As both silicon package size and TMD component size and weight continue to increase, it will further exacerbate these issues.

Techniques presented herein provide for precise control of TMD mounting forces for any TMD configuration during manufacturing assembly and for validating these assembly forces to improve ongoing manufacturing and product quality control systems. The techniques involve a system, a method, an assembly, and/or an apparatus for installing the TMDs on silicon components with a controlled, precise, repeatable, and verifiable force.

The techniques involve three main components:
(1) a TMD force-control mounting assembly (TFCMA) including special hardware that mounts the TMD securely to the PCB and/or silicon devices or components thereof,
(2) an instrumented actuator assembly or a driving mechanism that assists in applying programmable, measured forces during the TMD installation process, and
(3) a compression and locking interface that transfers mounting force between the instrumented actuator assembly/driving mechanism and the TFCMA.

Various non-limiting example embodiments of these components are described below in further detail.

FIG. 1A is a top view of a system 100 having a TMD installed onto a printed circuit board (PCB) using TMD force-control mounting assemblies (TFCMAs), according to an example embodiment. The system 100 includes a TMD 110, a plurality of TFCMAs 120*a-n*, and the PCB 130.

The notations "a-n" and the like denote that a number is not limited, can vary widely, and depends on a particular use case scenario, and need not be the same, in number. Moreover, this is only an example of the system 100, and the number and types of entities may vary based on a particular deployment and use case scenario, such as attributes and characteristics of the TMD 110, the TFCMAs 120*a-n*, and/or the PCB 130.

The TMD 110 may be any heat-dissipating or thermal energy directing device and is not limited to a heatsink. The TMD 110 is configured to maximize area in contact with a cooling medium such as air surrounding the TMD 110. The TMD 110 dissipates thermal energy generated by an electronic component into the surrounding environment by convection and/or conduction. The TMD 110 may have various shapes, sizes, materials, and configurations. The TMD 110 may be copper, aluminum, or other suitable material. The TMD 110 may be configured to circulate air and/or a cooling fluid. The TMD 110 is installed onto the PCB 130 to cool a silicon device or an electronic component thereon (not shown).

In the system 100, the TMD 110 is a heatsink and includes a base 112, fins 114, and installation holes 116. This is but one non-limiting example of the components of the TMD 110. Further, the number of fins 114 may vary. Moreover, length, height, width of the fins 114, the base 112, and the installation holes 116 may vary based on a particular use case scenario.

The PCB 130 may include various other components (not shown) and this is just one non-limiting example. That is, the TMD 110 can be installed on various types of electronic components such as an electronic chip, CPU, GPU, etc. The TMD 110 and the PCB 130 operate on any type of device such as servers, gateways, access points, controllers, routers, switches, and/or other network devices or management nodes. For example, a network device may include a number of electronic components (and TMDs for cooling) to perform networking functions. As another example, a management node may include a number of electronic components (and TMDs for cooling) to perform various control, management and data storage functions. In one implementation, there may be one-to-one correspondence between the electronic components and TMDs but in another implementation, several TMDs may cool one electronic component, and yet in another implementation, one TMD 110 may cool several electronic components mounted on the PCB 130.

The installation holes 116 are for mounting the TMD 110 onto the PCB 130 using the plurality of TFCMAs 120*a-n*. Location, size, and number of the installation holes 116 may vary based on a particular use case scenario.

The TFCMAs 120*a-n* are configured to securely mount or attach the TMD 110 to the PCB 130 and/or silicon device (electronic component), etc. The TFCMAs 120*a-n* include fasteners that are inserted into the installation holes 116 of the TMD 110 and attach to the PCB 130 and/or a base plate (not shown).

In the system 100, each of a first TFCMA 120*a*, a second TFCMA 120*b*, a third TFCMA 120*c*, and a fourth TFCMA 120*n*, is mounted into a respective one of the installation holes 116. The number of the TFCMAs 120*a-n* may vary based on the characteristics of the TMD 110 and other mounting points may exist (six, eight, etc.). Further, the location of the TFCMAs 120*a-n* may vary widely, based on the TMD 110, the PCB 130, and the electronic component(s) thereon with some installations fixed in a symmetric array, and others in asymmetric configurations.

Figure 1B:
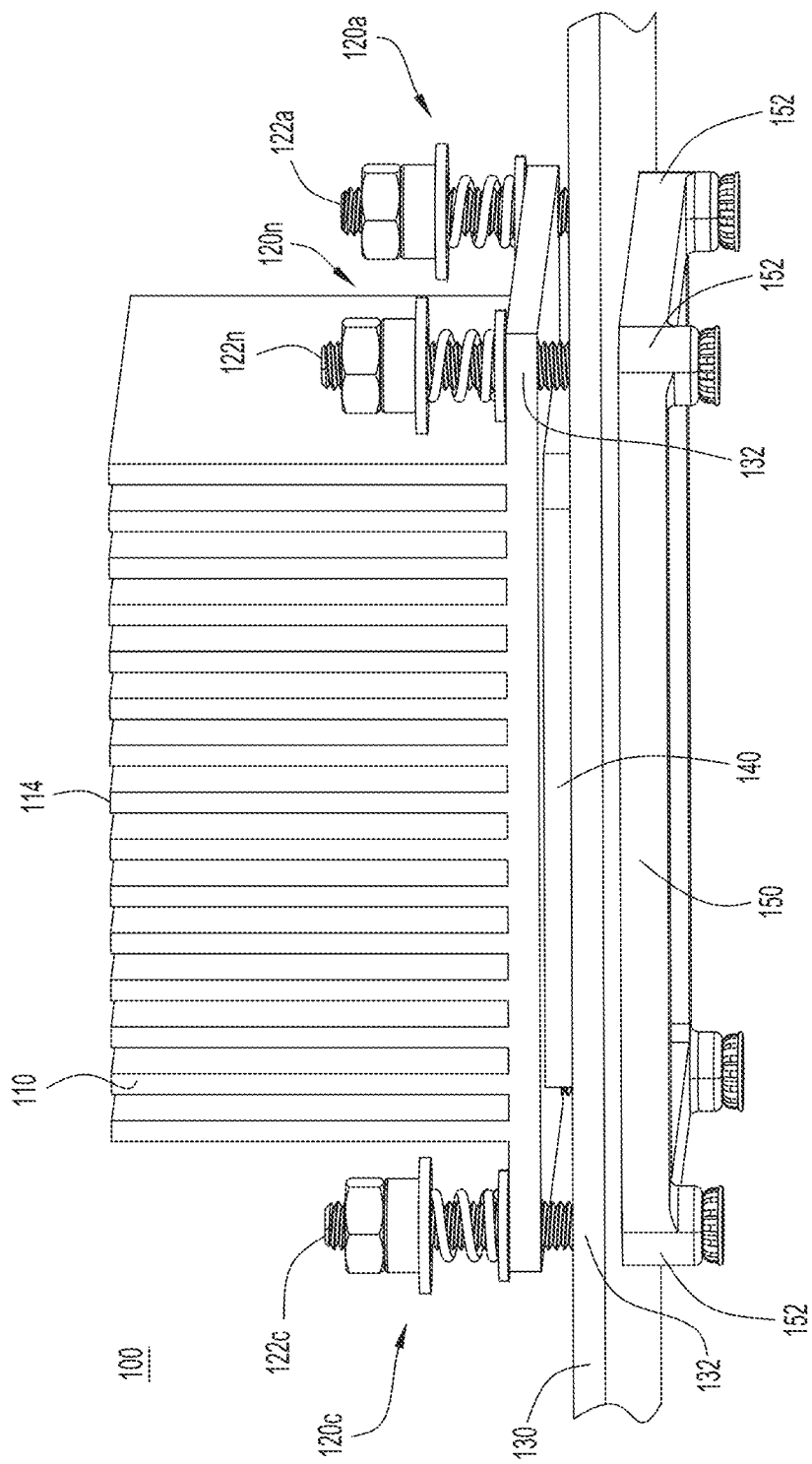
FIG. 1B is a side perspective view of the system of FIG. 1A, according to an example embodiment.

With continued reference to FIG. 1A, FIG. 1B is a side perspective view of the system 100, according to an example embodiment. The system 100, as shown in FIG. 1B, further includes a silicon device 140 mounted on the PCB 130 and a base plate 150.

The silicon device 140 is one example of an electronic component that is mounted onto the PCB 130 and is cooled by the TMD 110. The silicon device 140 is disposed between the TMD 110 and the PCB 130. Specifically, the TMD 110 is mounted onto the silicon device 140 such that it is offset from the PCB 130.

The base plate 150 may be made of metal material such as stainless steel but is not limited thereto. The base plate 150 is rigidly affixed to an underside of the PCB 130 by adhesives, interference fits, or other suitable means. The base plate 150 includes receptacles 152 to receive and hold the fasteners of the TFCMAs 120*a-n*. For example, the fasteners of the TFCMAs 120*a-n* are inserted through the installation holes 116 of the TMD 110 (FIG. 1A), through clearance holes 132 of the PCB 130, and into the receptacles 152. The installation holes 116, the clearance holes 132, and the receptacles 152 substantially align with one another so that the respective fasteners are inserted there through and are screwed rigidly into the base plate 150.

In one example, each of the TFCMAs 120*a-n* includes a fastener in a form of a vertical threaded stud. For example, the first TFCMA 120*a* includes a first threaded stud 122*a*, a second TFCMA 120*b* includes a second threaded stud (not shown), a third TFCMA 120*c* includes a third threaded stud 122*c*, and a fourth TFCMA 120*n* includes a fourth threaded stud 122*n*. The threaded studs 122*a-n* may include an exterior thread (e.g., M4×0.7) that mates with the receptacles 152 that are also threaded and situated in the base plate 150.

Figure 2A:
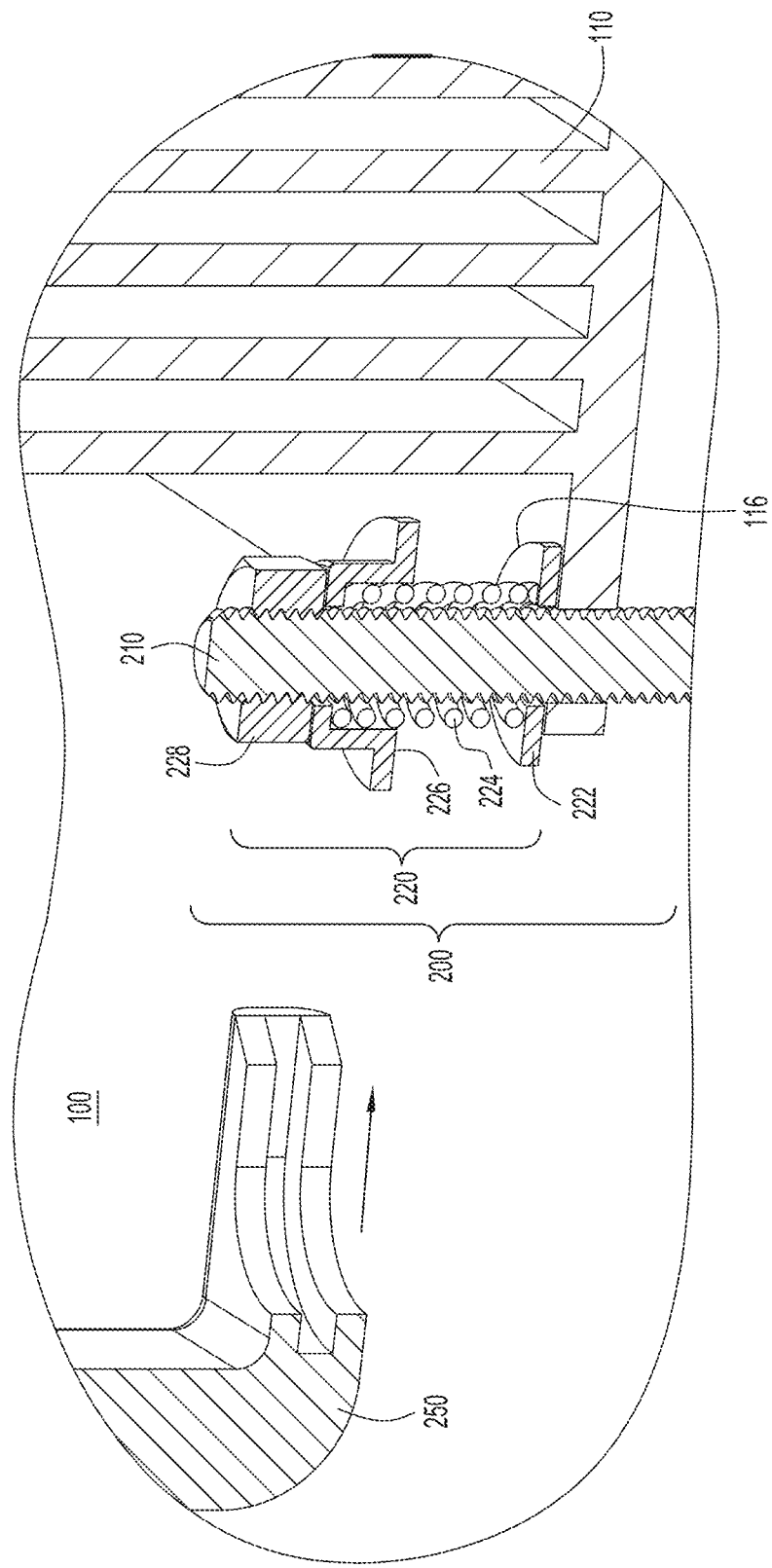
FIG. 2A is a cross-sectional view of a system in which various components of a TFCMA and a compression and locking interface are provided, according to an example embodiment

With continued reference to FIGS. 1A and 1B, FIG. 2A is a cross-sectional view of the system 100 in which components of a TFCMA and a compression and locking interface are provided in further detail, according to an example embodiment. The system 100 includes a TFCMA 200 and a compression and locking interface 250. The TFCMA 200 may be one of the TFCMAs 120*a-n* of FIGS. 1A and 1B.

Specifically, the TFCMA 200 includes a fastener 210 (e.g., threaded stud). The fastener 210 is configured to be inserted into one of the installation holes 116 of the TMD 110 and screw into one of the receptacles 152 of the base plate 150 (not shown in FIG. 2A). The fastener 210 is mounted with a component stack 220.

In this example, the component stack 220 includes a washer 222, a spring 224, a coupler 226, and a nut 228. This is but one non-limiting example of the component stack 220. The component stack 220 may include additional components such as additional couplers, bushings, pushpins, holders, springs, nuts, etc. and/or omit some of these components. Other fasteners and component stacks that provide sufficient force to securely install the TMD 110 are within the scope of this disclosure.

The washer 222 is a circular flat stainless-steel ring that slips over the fastener 210 (threaded stud) and distributes the spring load to the TMD 110. The washer 222 surrounds a respective one of the installation holes 116 and abuts against a base of the TMD 110.

The spring 224 is an example of a compression coil (e.g., a steel spring) that slips over the fastener 210 (threaded stud) and remains substantially collinear with the fastener 210. The spring 224 also includes ground ends that provide flat, even interfaces. In this example, the fastener 210 is a spring-loaded fastener or a stud.

The coupler 226 may be an annular bushing that houses the spring 224. The coupler 226 includes a short circular cylinder with an external annular rim. The coupler 226 (the bushing) slips over the fastener 210 (threaded stud) and sits atop the spring 224. The coupler 226 may include Oilite® bronze for strength and to reduce friction. The coupler 226 (the bushing) includes a threaded stud clearance hole and a cylindrical recess that captures the top of the spring 224, thus housing the spring 224 therein. The coupler 226 sidewall may be angled or beveled to provide lead-in that facilitates capturing spring 224 during assembly. Further, the top circular aperture edges of coupler 226 may be rounded to minimize sliding friction with fastener 210.

The nut 228 is a standard hexagonal fastener (M4 in this example) that screws onto the fastener 210 (threaded stud) and locks the coupler 226 into a specific vertical position.

The compression and locking interface 250 locks with the coupler 226 and compresses the spring 224 to a predetermined loading point using a controlled force from an actuator, described below, such that the fastener 210 is screwed in after the predetermined loading point is reached. That is, the compression and locking interface 250 latches to the coupler 226 and compresses the spring prior to the nut 228 being screwed in. As a result, the TMD 110 is mounted securely to the PCB 130 and the silicon device 140 at a predetermined loading point.

The TFCMA 200 is only an example and other mechanisms may be used with a compression and locking interface 250 described below to provide controlled and verifiable force for installing the TMD 110. The compression and locking interface 250 locks with and compresses the TFCMA 200 to a predetermined loading point using a controlled force to ensure proper installation of the TMD 110.

With continued reference to FIGS. 1A, 1B, and 2A, FIGS. 2B and 2C are views illustrating the system 100 before and after the compression and locking interface 250 engages with the TFCMA 200, respectively, according to an example embodiment.

The compression and locking interface 250 may be in a form of a compression fork, but this is just an example. The compression and locking interface 250 includes a main body 252 having laterally extending internal rails 254 that define an aperture 256. The internal rails 254 and the aperture 256 are configured to engage the coupler 226 (such as an annular bushing). That is, the aperture 256 and the internal rails 254 latch onto at least a portion of an external annular rim 230 of the coupler 226. FIG. 2B shows the compression and locking interface 250 before locking with the TFCMA 200.

In FIG. 2C, the compression and locking interface 250 locks with the TFCMA 200 by having the internal rails 254 latch onto a portion of the external annular rim 230. The compression and locking interface 250 fully seats on the coupler 226, thereby latching onto a portion of the annular rim 230 using at least one of the internal rails 254. A portion of the coupler (annular bushing) fits inside the aperture 256 when at least one of the internal rails 254 latches onto the portion of the external annular rim 230.

The fully-seated compression and locking interface 250 is able to apply a measured force to the coupler 226. After the coupler 226 is set at the desired mounting force, i.e., reaches the predetermined loading point 260, the nut 228 is threaded onto the fastener 210 to secure the coupler 226 in place (and lock-in the spring force, and thus, the TMD mounting force level). Once the coupler 226 is locked, the compression and locking interface 250 may be retracted.

The compression and locking interface 250 locks with the coupler 226 by latching onto a portion of the annular rim 230 using one of the internal rails 254 and the aperture 256. The compression and locking interface 250 applies a controlled force to compress the TFCMA 200 to the predetermined loading point 260 using the spring 224. When the TFCMA 200 is at the predetermined loading point 260, the fastener 210 may be secured therein e.g., by threading the nut 228 to lock the coupler 226 and thereby secure the mounting force. That is, the spring 224 is compressed prior to the fastener 210 being secured therein.

While the compression and locking interface 250 may be in a form of a fork or equivalent, some TMD installations may require a different type of interface. That is, while the compression and locking interface 250 works in many applications, some TMD installations have mounting hardware placed in tight or relatively inaccessible locations and may not be accessible with the compression and locking interface 250. A different type of compression and locking interface may be more useful when the TFCMAs have mounting locations embedded inside the perimeter of the TMD 110.

FIGS. 3A-3D are views illustrating a system 300 including a different type of compression and locking interface configured to engage various TFCMAs, such as TFCMAs that are embedded inside the TMD 110, according to another example embodiment. The system 300 includes the TMD 110, an embedded mounting assembly 310, and a linear compression and locking interface 320.

Figure 3A:
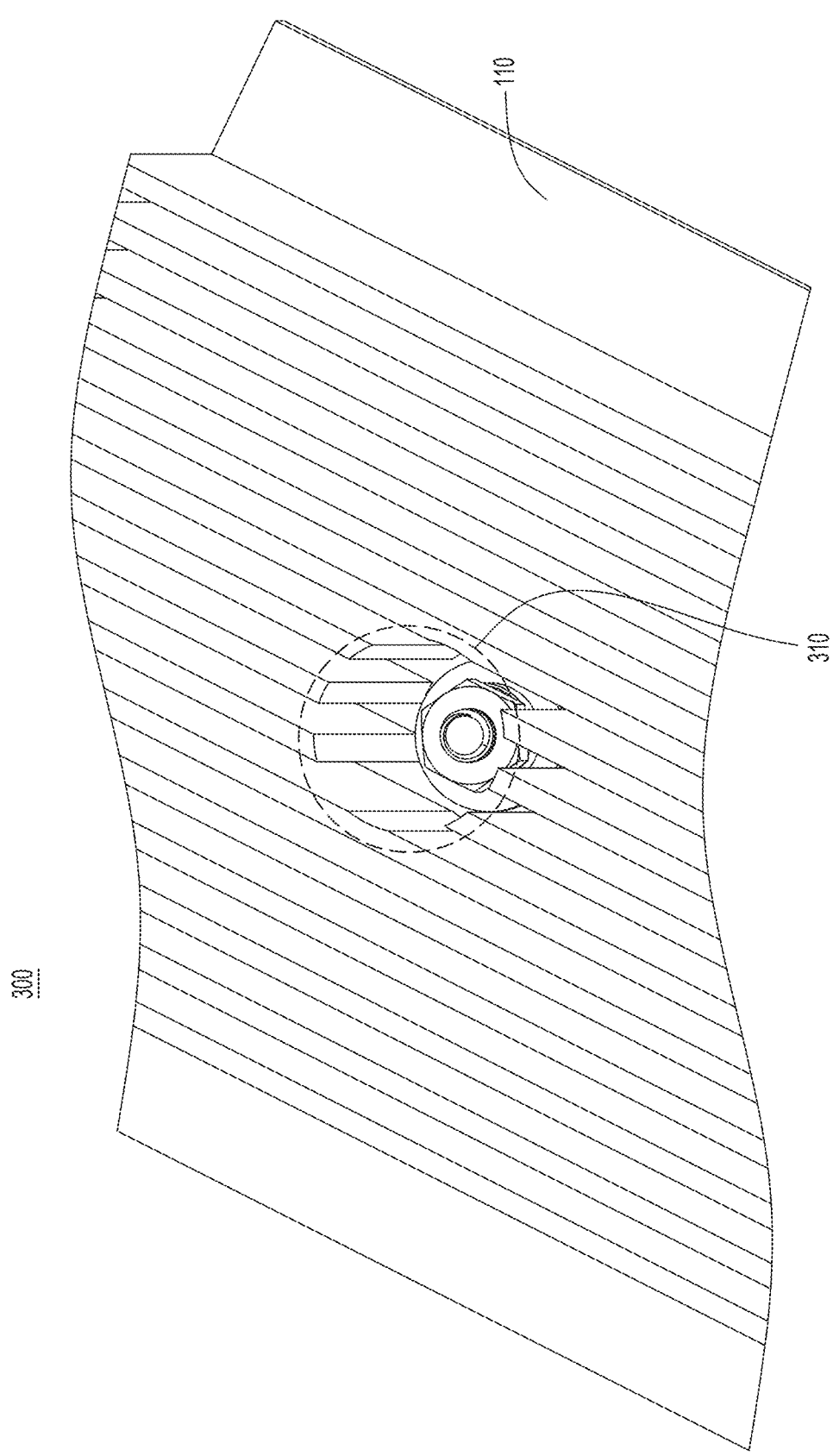
FIG. 3A is a view illustrating a system in which a mounting assembly, such as the TFCMA, is embedded inside the TMD perimeter, according to another example embodiment.

FIG. 3A shows the embedded mounting assembly 310 surrounded by the TMD 110. The embedded mounting assembly 310 may have some, all, or different components of the TFCMA 200. The embedded mounting assembly 310 has a different mounting location such that it is embedded within or at least partially surrounded by the TMD 110.

Figure 3B:
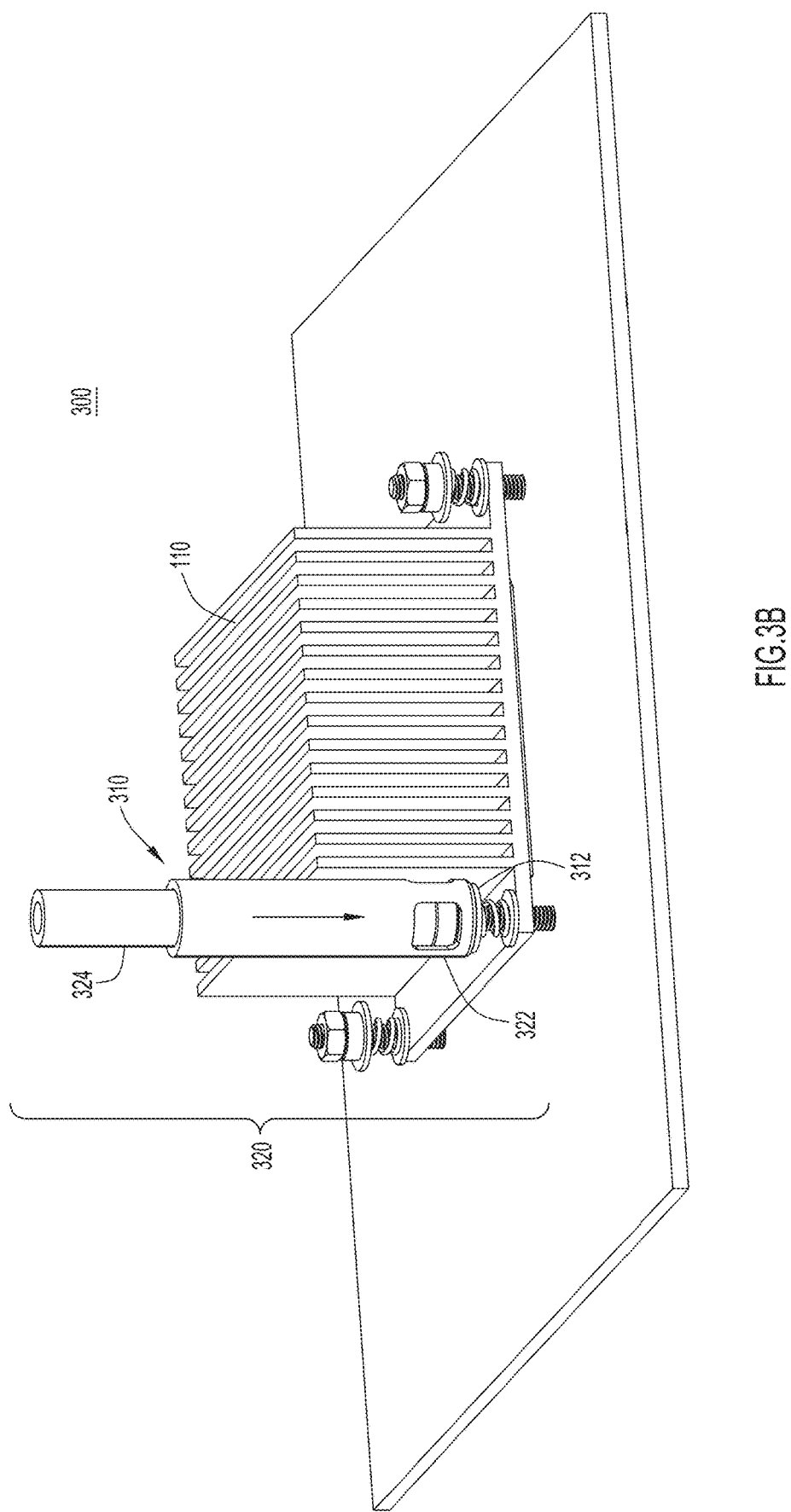
FIG. 3B is a view illustrating the system with a linear compression and locking interface for engaging the embedded mounting assembly, according to another example embodiment.

FIG. 3B shows the system 300 in which the linear compression and locking interface 320 engages with the embedded mounting assembly 310, according to another example embodiment.

In one non-limiting example, the linear compression and locking interface 320 has a cylindrical shape. The linear compression and locking interface 320 is positioned collinearly with the fastener of the embedded mounting assembly 310 and applies a controlled vertical mounting force. The linear compression and locking interface 320 engages mounting assemblies in difficult to reach mounting locations, thus addressing tight mounting hardware constraints. In addition, this method will also prove advantageous where mounting assemblies are placed in close proximity with one another. The linear compression and locking interface 320 includes a collinear pusher (pusher) 322 and a driver 324 (e.g., a pusher and driver compression and locking assembly).

The collinear pusher 322 is a hollow cylindrical component (a hollow cylinder) that is positioned collinearly with the fastener and provides the vertical controlled mounting force. The collinear pusher 322 may be made of stainless steel, in one example. The collinear pusher 322 locks with a fastener (such as a threaded stud) and bears directly onto the embedded mounting assembly 310. For example, the collinear pusher latches onto a ring coupler 312 of the embedded mounting assembly 310. The aforementioned beveled side walls on the ring coupler 312 also provide lead-in that helps facilitate engagement and release of the collinear pusher 322.

The driver 324 may be a hex driver component having a cylinder shape, and which freely rotates within the collinear pusher 322 (hollow cylinder). The driver 324 is nested inside the collinear pusher 322. The driver 324 is also positioned collinearly with the fastener of the embedded mounting assembly 310. The driver 324 holds a nut of the embedded mounting assembly 310 and screws it onto the fastener, such as the threaded stud, thus securing the fastener therein. In some implementations, the driver 324 may be made of magnetized steel or comprise a non-magnetic body that includes an embedded magnetic element, both of which help to conveniently retain the nut during assembly.

FIG. 3C is a part perspective and part cross-sectional view of the system 300 having the collinear compression and locking interface 320 engaging the embedded mounting assembly 310, according to another example embodiment.

The embedded mounting assembly 310 includes the ring coupler 312, a fastener 314, a spring 316, and a nut 318. The ring coupler 312 locks with the collinear pusher 322 and receives the compression force (vertical controlled mounting force) from the collinear pusher 322 to reach a predetermined loading point 340. Specifically, the fastener 314 is a spring-loaded fastener such that the spring 316 is compressed by the downward/vertical mounting force being onto the ring coupler 312. The ring coupler 312 may be an annular bushing that houses the spring 316. The collinear pusher 322 locks with the fastener 314 (threaded stud) by bearing directly onto an external annular rim of the ring coupler 312 from above. The collinear pusher 322 may include at least one internal rail that latches to a portion of an external annular rim of the ring coupler 312 from above, allowing the collinear pusher 322 to reach the embedded mounting assembly 310 in tight mounting locations. In addition, the collinear pusher 322 and the ring coupler 312 interface may be accomplished through a substantially planar interface, or the collinear pusher 322 may employ raised bumps that confine the interface to discrete points or regions. For example, three bumps that define the planar interface.

When the predetermined loading point 340 is reached, the driver 324, nested inside the pusher 322, threads the nut 318 onto the fastener 314, thus securing the fastener 314 therein. In one example, the driver 324 has a hexagonal cutout at its lower end that fits over the nut 318. This allows the driver 324 to thread the nut 318 onto the fastener 314 (threaded stud) without disturbing the pusher 322 or bearing once they are in a predetermined loading position or at the predetermined loading point 340 (by freely rotating therein).

Figure 3D:
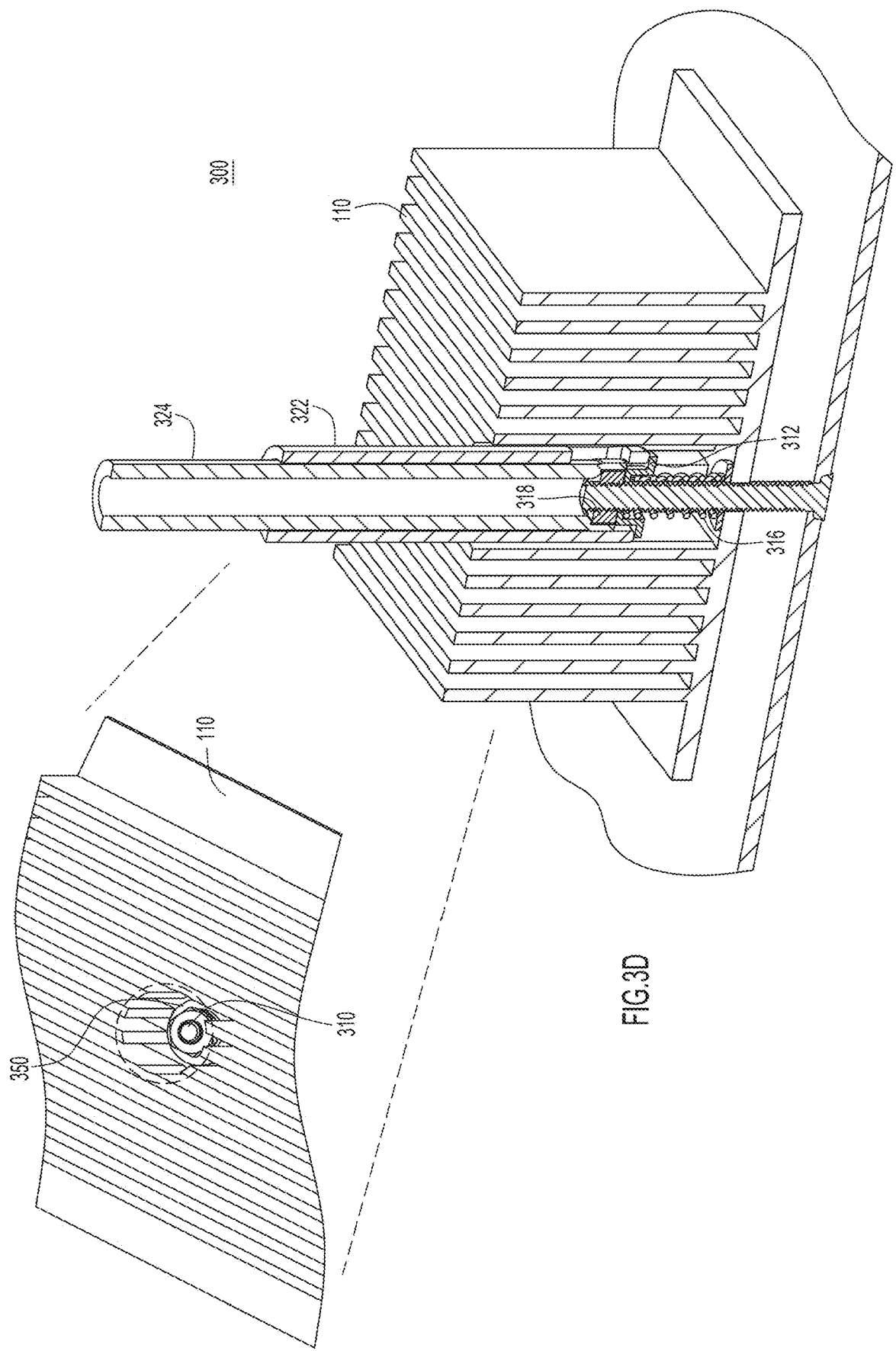
FIG. 3D is a part perspective and part cross-sectional view of the system having the collinear compression interface engaging the embedded mounting assembly at a difficult mounting location, according to another example embodiment.

FIG. 3D is a part perspective and part cross-sectional view of the system 300 showing the linear compression and locking interface 320 engaging the embedded mounting assembly 310 at a difficult or tightly-nested mounting location, according to another example embodiment. The collinear compressing and locking interface 320 is particularly advantageous in these challenging mounting applications. Specifically, the embedded mounting assembly 310 is within a cavity 350 of the TMD 110. The collinear compression and locking interface 320 fits into the cavity 350 to lock with from above and to apply downward compression force (a vertical controlled mounting force) onto the embedded mounting assembly 310 thus compressing the mounting assembly 310 to a predetermined loading point 340 prior to securing the fastener 314 therein e.g., by screwing the nut 318 or by applying other mechanical means to secure the fastener 314 therein.

In another example embodiment, the collinear pusher 322 has a hexagonal internal surface that advances the nut 318 after the predetermined loading point 340 is reached. The hex profile inside the collinear pusher 322 keeps a constant force and may include a low friction surface (e.g., Teflon® surface) bearing in between so that the collinear pusher 322 is rotated while minimizing the friction between the collinear pusher 322 and the ring coupler 312 (e.g., annular bushing). For example, the collinear pusher 322 and the driver 324 are integrally formed.

In yet another example embodiment, the collinear pusher 322 may be a low friction metal, such as Oilite® bronze. The collinear pusher 322 may be made of stainless steel while the driver 324 is made of bronze to decrease the friction between the two components of the compression and locking interface 320.

In yet another example embodiment, the compression and locking interface 320 may include the pusher 322 in a form of a hollow cylinder that is integrally formed with the driver 324 and another lubricious material such as Delrin, that is interposed between the two. The driver freely rotates within the pusher and the intermediate material (interposed between the collinear pusher 322 and the driver 324) ensures alignment and avoids friction.

The shape, size, and materials of the compression and locking mechanism or interface may vary based on a particular use case and based on characteristics and a mounting location of the TMD 110 and the composition of the mounting assembly. The compression and locking interface is configured to lock with the mounting assembly at a mounting location and apply a controlled, compression force (vertical controlled mounting force), using an actuator, for example, until a predetermined loading point is reached. While the mounting assembly is described in a form of a spring-loaded fastener, a pushpin, and other mounting assemblies are within the scope of the disclosure. When the mounting assembly reaches a predetermined loading point, it is secured therein e.g., by screwing a nut, so that the TMD 110 is installed at a target compression force. To ensure that the nut 318 remains in place after installation, further measures such as an additional lock nut or fixative substances may be applied. For example, Loctite may be applied to an interface of the nut 318 and the fastener 314.

According to one or more example embodiments, various driving mechanisms drive the compression and locking interface at a predetermined and controlled mounting force to the predetermined loading point. In one form, the driving mechanism may be an instrumented actuator assembly. In another form, the driving mechanism may be a motor. The driving mechanism may be colinear with or offset from the compression and locking interface, as detailed below.

According to one example embodiment, the driving mechanism is an instrumented actuator assembly that is used in conjunction with a compression and locking interface to set the TMD 110 at the desired compression force prior to securing the mounting assembly in place. The actuator assembly ensures that one or more compression and locking interfaces apply a predetermined, controlled, and verifiable mounting force and reach the predetermined loading point or target mounting/compression force, as detailed below.

Figure 4A:
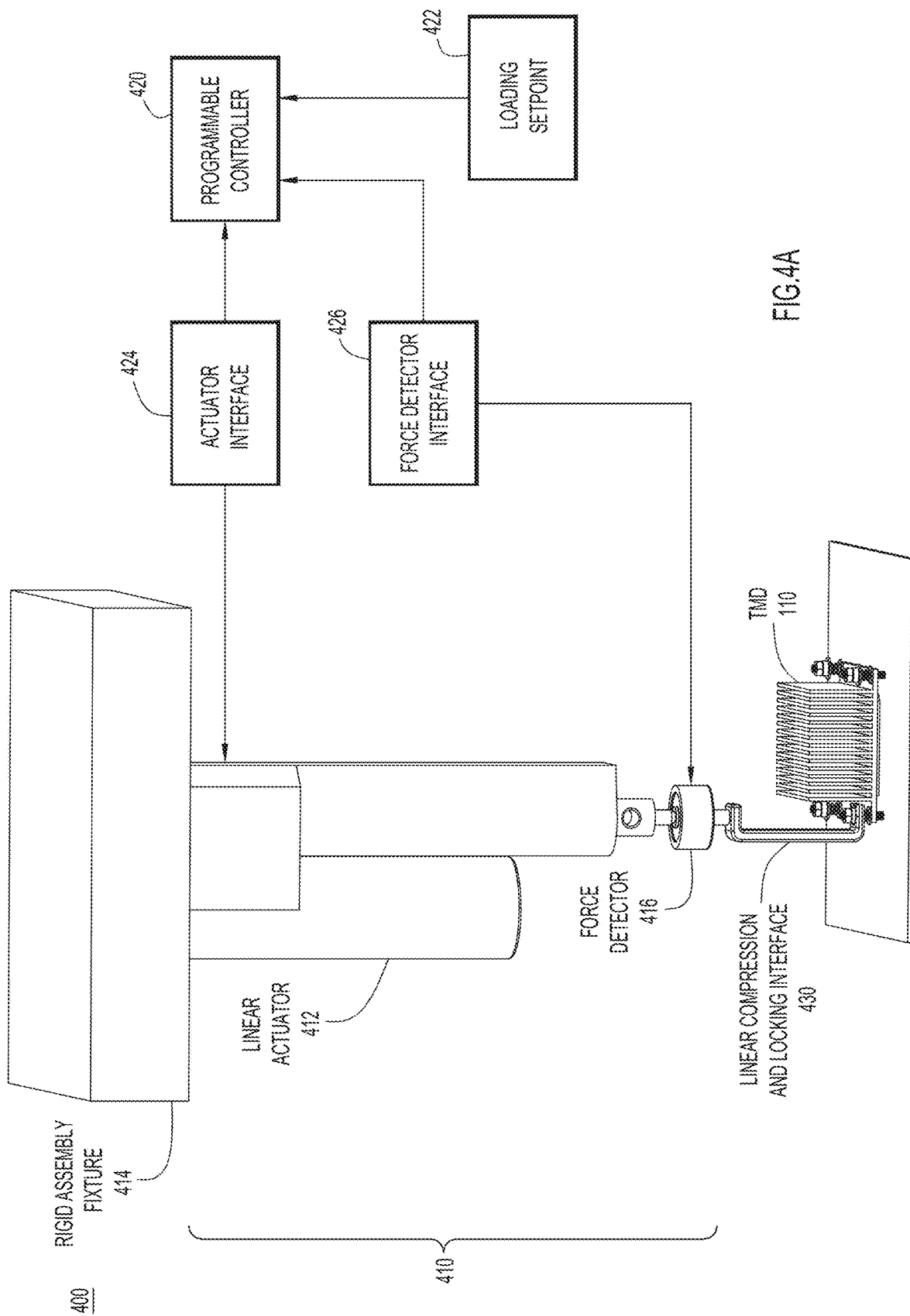
FIG. 4A is a diagram of an actuator system configured to drive a compression and locking interface, according to yet another example embodiment.

FIG. 4A is a diagram illustrating an actuator system 400 configured to drive a compression and locking interface, according to yet another example embodiment. The actuator system 400 includes an actuator assembly 410 and a programmable controller 420. The actuator assembly 410 is configured to drive a compression and locking interface 430 such as the compression and locking interfaces described in connection with FIGS. 2B, 2C, and 3B-3D. The programmable controller may include one or more processors and memory for storing instructions.

The actuator assembly 410 includes a linear actuator 412, a rigid assembly fixture 414, and a force detector 416. The linear actuator 412 is configured to provide an assembly force (compression force) and is rigidly attached to the rigid assembly fixture 414 (rigid fixture). The linear actuator 412 is also connected to the compression and locking interface 430 through the force detector 416. The linear actuator 412 drives the compression and locking interface 430 by advancing the compression and locking interface 430 into the mounting assembly (not shown) to apply a downward or vertical mounting force and by retracting the compression and locking interface 430, e.g., when the predetermined loading point is reached.

The rigid assembly fixture 414 (rigid fixture) is a rigid mounting platform or a component piece configured to withstand the compression force applied by the compression and locking interface 430 by using the linear actuator 412.

The force detector 416 may be a compression sensor, an instrumented load cell, a one-dimensional force sensor, an electronic force gage, etc. configured to sense the compression force i.e., detect a current mounting force. The force detector 416 senses or detects the mounting force being applied by the compression and locking interface 430 (in lbs., kg, etc.) and converts the measured physical force to a suitable output such as an analog voltage or a digital figure. The force detector 416 may have various shapes e.g., linear or toroidal.

A programmable controller 420 is configured to interface with the actuator assembly 410 to control the actuator assembly 410 and to receive feedback from the actuator assembly 410, e.g., a current mounting force detected by the force detector 416 (a sensor). By interfacing with the linear actuator 412 and the force detector 416, the programmable controller 420 controls the overall assembly process or the installation process of the TMD 110, to provide software-controlled load magnitude and rate.

The assembly process involves attaching the TMD 110 to a silicon device and/or the PCB and/or the base plate using a mounting assembly. Specifically, the programmable controller 420 may control the assembly process as follows.

At 422, a loading setpoint or a predetermined loading point is input into the programmable controller 420. The predetermined loading point is the target load desired for the specific TMD mounting point (e.g., in pounds (lbs.), Newtons (N), etc.). The predetermined loading point may be based on previous analysis and/or testing. The predetermined loading point may be input by an operator or set based on the characteristics of the TMD 110 and the mounting assembly, automatically programmed directly from another system (such as statistical process control or quality yield management system) or may be a default value. For example, the predetermined loading point may be set as a function of the specific silicon type and configuration (not to crush the silicon) and/or compression load for the mounting assembly to work (e.g., for a thermal contact). Additionally, the programmable controller 420 may obtain a loading/force/speed profile for the actuator 412. That is, the profile may indicate that the actuator 412 is to operate at a high speed until it is x % from the target loading point. At this point, the actuator 412 is to switch to a slower speed until is it y % from the loading point and then to the slowest speed until the target force/loading point is reached. In other words, the profile may indicate that the speed of compressing the mounting assembly should be decreasing as the current mounting force approaches the target mounting force. This is but one non-limiting example of the actuator profile. In another example, the actuator profile may include varied speeds, forces, and various setpoints or % values.

The mounting assembly is placed onto the TMD 110. For example, a washer, a spring, a coupler (annular bushing), and a nut may be positioned onto the fastener (threaded stud) that is inserted through assembly holes (e.g., installation holes 116 in FIG. 1A).

At 424, the programmable controller 420 communicates with the linear actuator 412 so that the compression and locking interface 430 is disposed over or onto a portion of the coupler (annular bushing) of the mounting assembly. In another example embodiment, the compression and locking interface 430 may be manually latched onto the mounting assembly. The programmable controller 420 sends commands/signals, via an actuator interface, to the linear actuator 412 to drive or extend the compression and locking interface 430 at a predetermined mounting force to compress the spring that may be housed in the annular bushing, as described above.

At 426, via a force detector interface, the programmable controller 420 obtains a continuous force feedback from the force detector 416 through a control-feedback loop. The continuous force feedback indicates current force and/or current loading point of the mounting assembly. The continuous force feedback provides direct measurements (detected, sensed values) of the current mounting force and/or loading point. The force detector 416 continuously detects the current mounting force of the mounting assembly and provides the measure(s) to the programmable controller 420. Various measures such as machine learning and artificial intelligence may be used to help characterize, tune, and optimize the control and feedback process.

The programmable controller 420 drives the actuator 412 until the predetermined loading point and/or target mounting force is reached. As noted above, the programmable controller may drive the actuator 412 at a slower speed (decreasing the speed) as the compression and locking interface approaches the target mounting force and/or the predetermined loading point. The linear actuator 412 is driven until the desired loading point/target mounting force is reached. In one example, the degree of mounting force applied and the speed may be varied using an actuator profile. In addition, for example, a profile of the programmable controller 420 is designated to overshoot the loading setpoint 422 by a specified force to allow for any force relaxation during the interface locking process that may be identified during system testing. Further, programmable controller 420 may be programmed to induce an oscillatory or other non-linear force pattern to help set a TIM or to condition springs by preloading.

The control-feedback loop provides direct measurements (detected values) of the current mounting force. Since the compression and locking interface 430 locks and compresses in one motion, for example, direct measurement of the spring constant is obtained without peripheral forces acting thereon e.g., if a nut is being screwed at the same time. The direct spring constant measurement and characterization therefore may be used to further optimize the programmed force profile mentioned previously. The predetermined loading point is reached prior to securing the fastener in place. After the predetermined loading point and/or target mounting force is reached, the fastener is secured therein e.g., by screwing the nut onto the threaded stud (preventing the coupler from moving) and thus, fixing the load at the predetermined loading point. Programmable controller 420 may also capture the full assembly sequence loading curve and final loading force and write this information to a memory (not shown). This information may be added to parallel testing and quality-control records to establish a permanent record verifying how the TMD 110 assembly was performed and associated to a specific PCB and/or product serial number. This information may help inform future quality performance and serve as a method to improve assembly management.

Figure 4B:
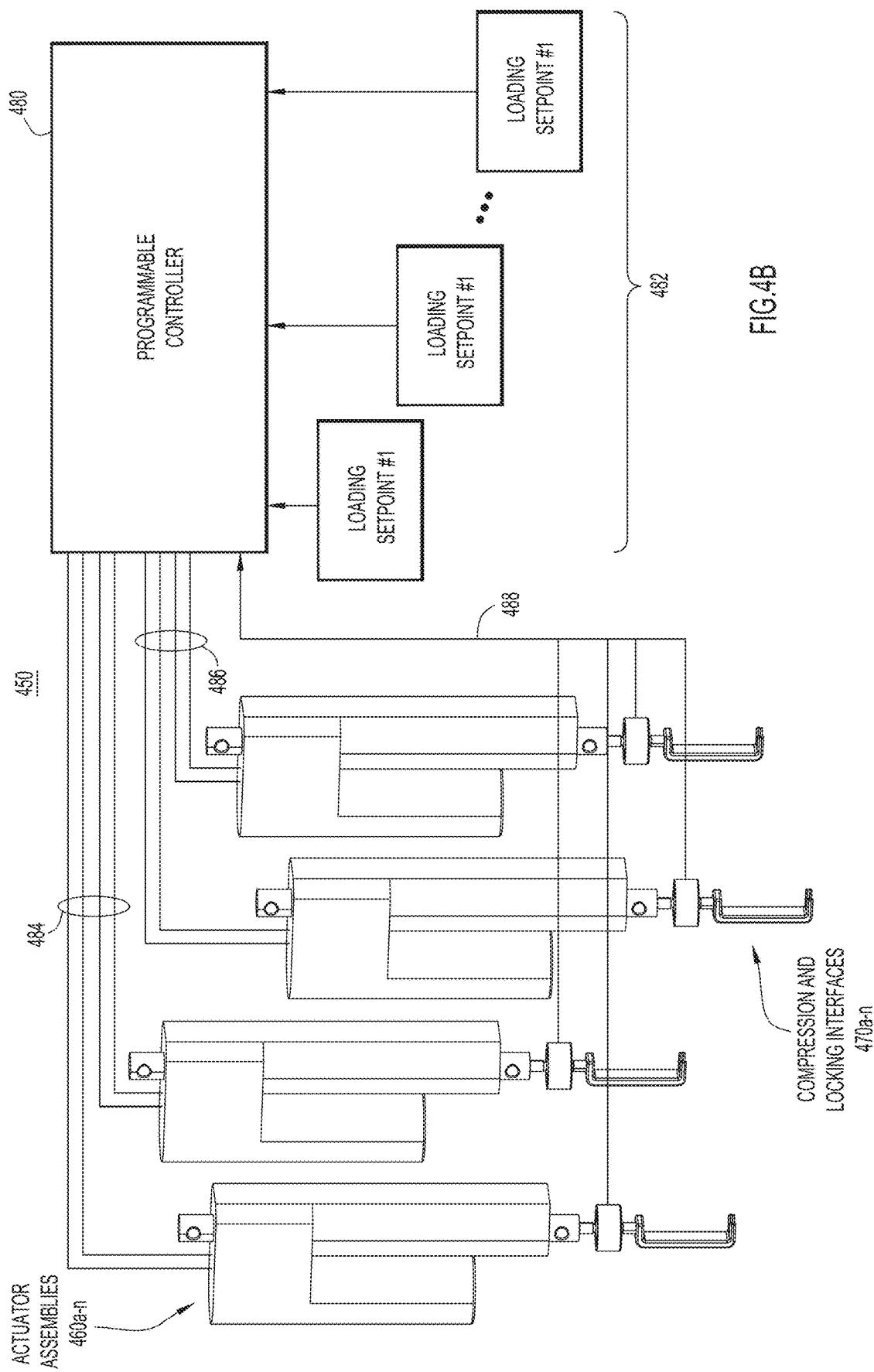
FIG. 4B is a diagram of a multi-actuator system for multiple compression and locking interfaces, according to yet another example embodiment.

While the system 400 illustrates an operation of a single actuator assembly 410, example embodiments are not limited thereto. In some example embodiments, a system includes multiple actuator assemblies that operate in parallel in a complementary fashion to load a desired component onto another component. To this end, reference is now made to FIG. 4B. FIG. 4B illustrates a multi-actuator system 450 for multiple compressing and locking interfaces, according to yet another example embodiment. The multi-actuator system 450 includes a plurality of actuator assemblies 460a-n, a plurality of compression and locking interfaces 470a-n, and a programmable controller 480.

Each of the actuator assemblies 460a-n may take the form of the actuator assembly 410 shown FIG. 4A. Each of the actuator assemblies 460a-n respectively drives one of the compression and locking interfaces 470a-n. An example of the compression and locking interface is described above in connection with FIGS. 2B, 2C, 3B-3D, and 4A.

One advantage of the system 450 is that the TMDs are assembled with equally-distributed forces. This would help prevent side-loading the silicon component caused by "rocking" the TMD 110, for example, as successive mounting fasteners are tightened.

Specifically, at 482, the programmable controller 480 obtains target setpoints (predetermined loading points) for each of the mounting assemblies. That is, the target mounting forces are individually set for each mounting assembly and may vary from one another. For example, when the TMD is asymmetrical, the target mounting forces may be different values for various mounting assemblies.

At 484 and at 486, the programmable controller 480 transmits a command and/or a control signal to each of the actuator assemblies 460a-n with a respective compression force and speed based on an individual actuator profile. The commands and/or control signals need not be the same such that at 484, a first set of the actuator assemblies 460a-n are driven at a first speed to a first setpoint and at 486, a second set of the actuator assemblies 460a-n are driven at a second speed to a second setpoint. While being individually driven, the programmable controller 480 synchronizes the process of compressing the mounting assemblies with one another. Synchronizing the process of compressing the mounting assemblies may help ensure that the forces are equally-distributed to avoid rocking the TMD.

Additionally, different set of commands may be based on the feedback loop. At 488, the programmable controller 480 obtains current mounting force and/or current loading point of each of the compression and locking interfaces 470a-n. If one or more locking interfaces 470a-n are determined to be uneven (different from the loading point of the other ones such as caused by different spring rates due to varying spring constant tolerance), its compression force may be adjusted individually and separately. That is, the individually programmable fasteners or mounting assemblies allow for software-controlled compensation for non-evenly distributed fasteners and account for tolerance differences in the assembly components. The system 450 accounts, for example, for some fasteners or mounting assemblies that are close to the silicon device to exert greater loading (control signals at 484) while other fasteners or mounting assemblies that are situated further away to exert a less loading (control signals at 486).

In one or more example embodiments, each predetermined loading point and/or target mounting force is individually configurable and adjustable. This allows improved control over TMD and silicon device co-planarity, and also addresses circumstances in which there is a lack of planarity for which active compensation in installing the TMD is useful. This arrangement is also useful to handle a TMD with a complicated geometry, i.e., when the TMD is not symmetrical. In one example, the programmable controller 480 may control the actuator assemblies 460a-n so that the mounting assemblies reach different predetermined loading points but at substantially same time (synchronously driven to individual target loading points). This helps avoid applying different forces on a silicon device, thus providing substantially linear compression while minimizing shear forces experienced by the silicon device. By synchronously driving the actuator assemblies, the TDM is mounted more quickly onto the PCB. Programmability also allows individual actuator assemblies 460a-n to be reused and redeployed quickly to other assembly applications i.e., the actuator assemblies 460a-n can be considered as movable modules that can be used in a flexible fashion for new devices.

The actuator assemblies 460a-n are just one example of the driving mechanisms. In another example embodiment, the driving mechanisms may be motors. Further, in one example embodiment, the driving mechanisms are offset from the compression and locking interface and in another example embodiment, the driving mechanisms are colinear with the compression and locking interface. Yet in another example embodiment, some of these driving mechanisms may be offset while others are colinear, based on the geometry and other characteristics of the mounting assembly.

Figure 5B:
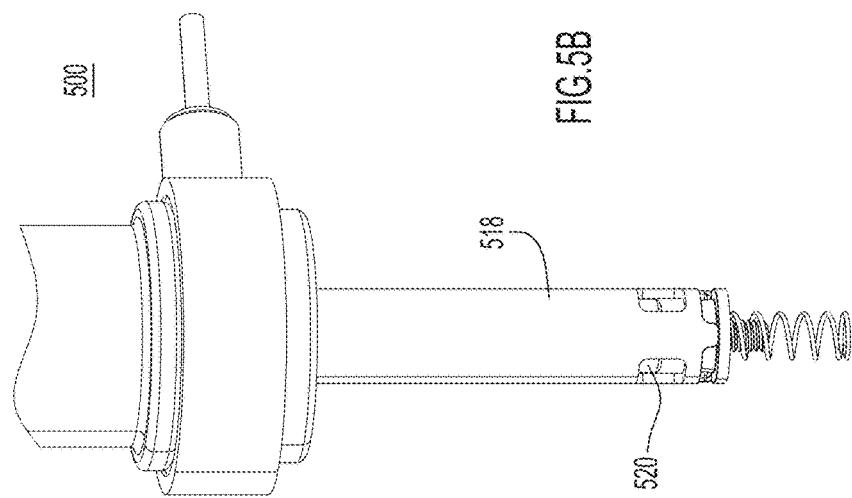
FIG. 5B illustrates the system of FIG. 5A with the compression and locking interface in a retracted state, according to another example embodiment.
Figure 5A:
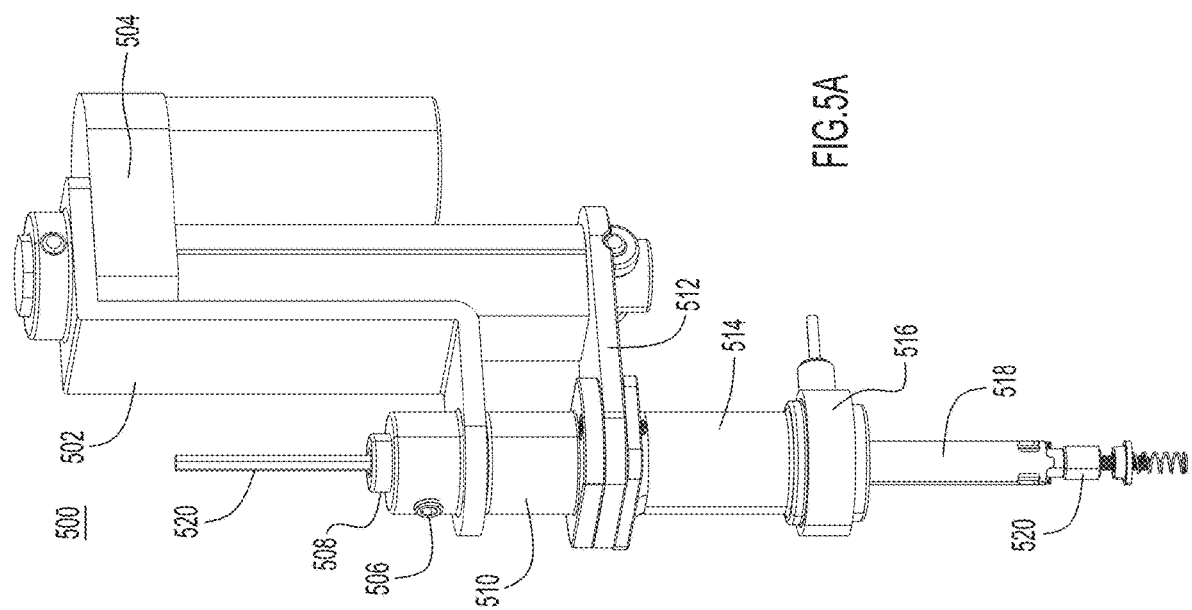
FIG. 5A is a perspective view of a system with an offset driving mechanism in which a compression and locking interface is in an extended state, according to yet another example embodiment.

FIG. 5A is a perspective view of a system 500 with an offset driving mechanism in which a compression and locking interface is in an extended state, according to yet another example embodiment. The system 500 is an "offset donut" because the driving mechanism is offset from the compression and locking interface and the force detector is in a toroidal or "donut" shape that allows the fastener driver to operate independently of the compression and locking interface, as explained below.

The driving mechanism of the system 500 includes a fixed adaptor 502, a linear actuator 504, a first bearing cylinder 506, a second bearing cylinder 508, a linear bearing 510, and a thrust plate 512.

The second bearing cylinder 508 is locked to the fixed adaptor 502 and both do not move. The fixed adaptor 502 is a support component that partially embeds the linear actuator 504. The fixed adaptor 502 may be any suitable shape such as U or V-shaped. The fixed adaptor 502 does not move and has a plate-like extension onto which the first bearing cylinder 506 is fixed. First bearing cylinder 506 may be a contiguous element of fixed adaptor 502, or a separate element rigidly affixed by welding or bolts. Additionally, set screw(s) threaded through the first bearing cylinder 506 are used to secure the fixed adaptor 502 to the second bearing cylinder 508 and allow placement adjustments, if needed. In this way, the second bearing cylinder 508 is substantially collinear with first bearing cylinder 506 and is also fixed in place (stationary). The second bearing cylinder 508 is formed from a rigid material such as steel and is highly polished to minimize surface friction. Further the second bearing cylinder 508 has an axial hole that extends through its full length for an upper portion of a fastener driver 520 of the compression and locking interface to extend therethrough. One or more screws may be used to further secure the assembly in place.

An extending member of the linear actuator 504 moves together with the linear bearing 510 and the thrust plate 512. This arrangement provides a smooth vertical sliding motion for the system 500 i.e., for the compression and locking interface. The linear bearing 510 and the thrust plate 512 slide up and down based on the motion of the extending member of linear actuator 504. Further, the linear bearing 510 slides smoothly over the second bearing cylinder 508. The thrust plate 512 transfers the motion of the extending member of linear actuator 504 onto the linear bearing 510.

The system 500 may further include a spacer tube 514 that separates the driving mechanism from the compression and locking interface and a force detector (load cell) 516. The length of the spacer tube 514 may be altered to accommodate the length of various, different types of the second bearing cylinder 508 and actuating distances. The compression and locking interface colinearly connects to the spacer tube 514.

The compression and locking interface includes a pusher 518 and a fastener driver 520. The pusher 518 has a flange (not shown) to hold the load cell 516. The fastener driver 520 captures a head of a fastener (e.g., M4×0.7 socket-head bolt) of a mounting assembly and helps align the fastener to screw into a hole of the TMD and/or PCB. The fastener driver 520 is configured to rotate and does not contact the pusher 518. The fastener driver 520 moves independently (both in rotation and axial position) of the pusher 518.

The load cell 516 is configured to provide feedback of the current mounting force applied to the mounting assembly by the pusher 518. The load cell 516 is toroidal or donut shaped. Because the load cell 516 is donut shaped, it can be integrated with the compression and locking interface. That is, the fastener driver 520 extends through a hole in the load cell 516 without contacting the load cell 516. This positioning of the load cell 516 provides for continuously measuring the pushing force exerted by the pusher 518 onto a spring and/or a bushing of the mounting assembly without motions and/or forces of the fastener driver 520 interfering. That is, the load cell 516 only registers the mounting forces of the pusher 518 and is independent of the forces exerted by the fastener driver 520. Since the load cell 516 surrounds (without abutting) the fastener driver 520, the fastener driver 520 does not interfere with measurements of the load cell 516.

Additionally, the system 500 is a robust assembly in which components are securely connected to one another and in which the fastener driver 520 does not contact the load cell 516 and the driving mechanism. That is, the driving mechanism is offset from the locking and compression interface such that the fastener driver 520 is independent of the load cell 516 and the driving mechanism i.e., the linear actuator 504. With this arrangement, the fastener driver 520 may extend throughout the system 500 with its top end parallel to the driving mechanism and the bottom end extending into the embedded mounting assembly when extended. The driving mechanism is moved out of the way to help with space constraints. For example, by offsetting the driving mechanism, space is provided for the fastener driver 520 in its retracted state.

With continued reference to FIG. 5A, FIG. 5B illustrates the system 500 with the compression and locking interface being in a retracted state. That is, the fastener driver 520 is retracted inside the pusher 518.

With continued reference to FIGS. 5A and 5B, FIG. 5C illustrates the system 500 transitioning from the retracted state to the extended state, according to another example embodiment. The system 500 includes the driving mechanism 530 such as the one in FIG. 5A.

At 532, the system 500 is in the retracted state. The driving mechanism 530 and the compression and locking interface are retracted. The bottom end of the fastener driver 520 is normally positioned within the pusher 518. In another example embodiment, the bottom end of the fastener driver 520 is extended to interface with a locking mechanism (not shown) even before transitioning to an extended state. The top end of the fastener driver 520 extends at an approximately same height (in a vertical direction) as the driving mechanism 530. Since the driving mechanism 530 is at an offset position, the fastener driver 520 can extend parallel thereto.

At 534, the controller (not shown) instructs the system 500 to transition to the extended state to lock with the mounting assembly and to apply a predetermined mounting force to the mounting assembly (not shown). The bottom end of the fastener driver 520 and the pusher 518 are extended in a downward vertical direction i.e., toward the mounting assembly.

At 536, the system 500 is in the extended state. For example, the pusher 518 is extended by about 50 mm, which is extended based on the downward motion of the linear actuator 504 of the driving mechanism 530 that slides the linear bearing 510 and the thrust plate 512 downward. The downward motion of the linear actuator 504 along with the thrust plate 512 pushes the pusher 518 onto the bushing and/or spring of a mounting assembly to a predetermined pre-loading force.

FIG. 5D is a part perspective and part cross-sectional view of the system 500. In the system 500, the load cell 516 surrounds (without contact) the fastener driver 520 and detects the current mounting force exerted onto a mounting assembly by the pusher 518. The mounting assembly includes a spring 542, a fastener 544, and a bushing 546. The pusher 518 locks with the bushing 546 and compresses the spring 542 to a predetermined mounting force. The pusher 518 is pushed downward (in this example) by the linear actuator 504 of the driving mechanism 530. The fastener driver 520, nested inside the pusher 518, drives the fastener 544 without disturbing the pusher 518. In other words, the pusher 518 and the fastener driver 520 operate independently of one another. Further, since the load cell 516 only abuts the pusher 518, the forces exerted on the mounting assembly by the fastener driver 520 do not impact measurements made by the load cell 516.

In the system 500, the compression interface colinearly connects to the spacer tube and locks with and compresses the mounting assembly.

FIG. 6A is a perspective view of a system 600 with a collinear driving mechanism driving the compression and locking interface, according to yet another example embodiment.

The compression and locking interface includes a pusher 616 and a fastener driver 618 such as the ones explained above with reference to FIGS. 5A-5D.

The collinear driving mechanism includes a motor 602, a fixture plate 604, a bearing cylinder 606, a lead screw adaptor 608, a threaded pusher adaptor 610, a pin guide 612, and a pin feature 620. The motor 602 may be a stepper motor that is donut shaped (has a hole in the middle) for the fastener driver 618 to extend therethrough. The motor 602 exerts only a vertical force (to move the assembly up and down) and does not cause rotation due to the pin guide 612 and the pin feature 620. Specifically, the threaded pusher adaptor 610 is prevented from rotating by the pin feature 620. Instead, the threaded pusher adaptor 610 may move up and down along the pin guide 612. The threaded pusher adaptor 610 holds the pusher 616 and has an internal lead screw adaptor 608 that is exposed based on the movement of the threaded pusher adaptor 610, driven vertically by the motor 602.

The motor 602 is attached to the fixture plate 604 via screws, for example. The motor 602 and the fixture plate 604 is stationary and do not move. Motor 602 rotates bearing cylinder 606 which is rigidly affixed to the motor rotor shaft. Bearing cylinder 606 in turn rotates the lead screw adaptor 608, which then threads with the pusher adaptor 610. The pin feature 620 prevents the pusher adaptor 610 from rotating and the pusher adaptor 610 only moves up or down (extends and retracts).

Figure 6B:
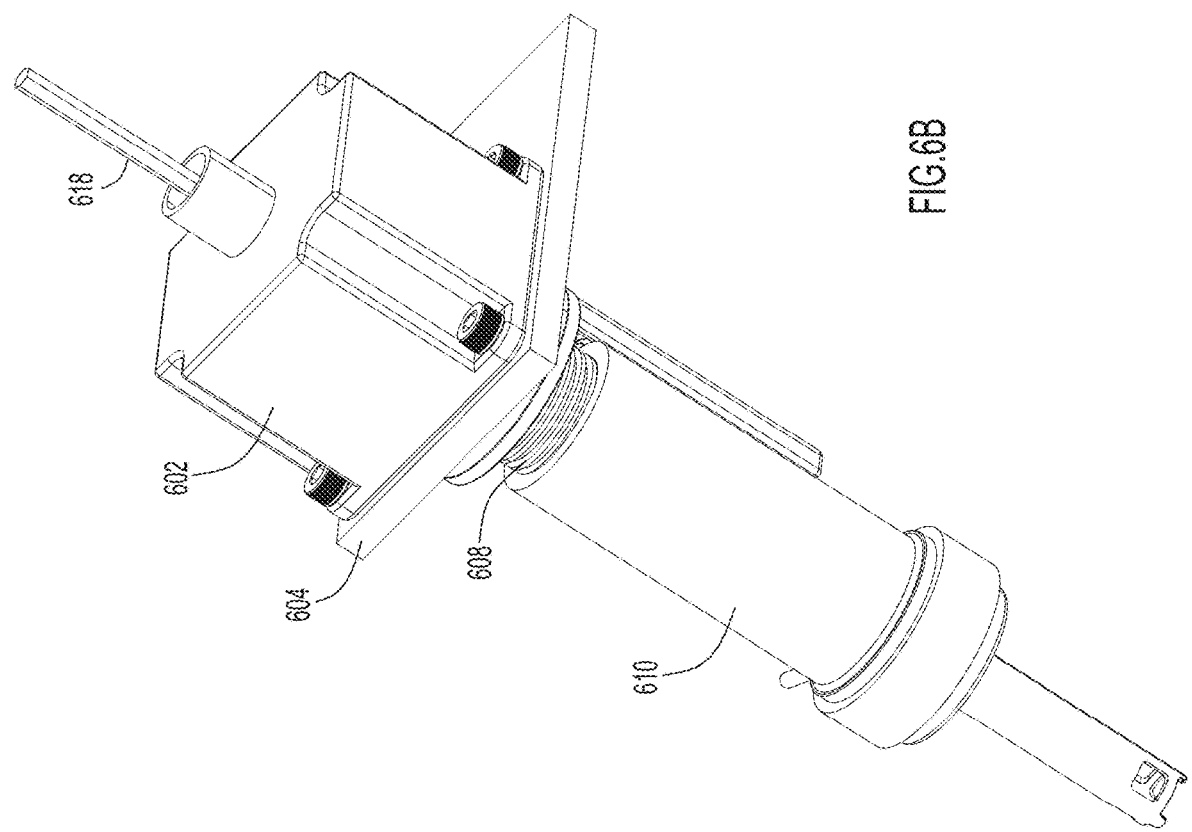
FIG. 6B is a side view of the system of FIG. 6A, according to another example embodiment.

With continued reference to FIG. 6A, FIG. 6B is a side view of the system 600 of FIG. 6A. The fastener driver 618 extends through the motor 602, the fixture plate 604, the lead screw adaptor 608, and the threaded pusher adaptor 610. The fastener driver 618 is configured to screw the fastener (or another mounting component such as a nut, etc.) of the mounting assembly by moving downward and/or rotating the fastener into a hole of the TMD. The fastener driver 618 does not contact the motor 602, the fixture plate 604, the lead screw adaptor 608, the threaded pusher adaptor 610, nor the pusher 616. The fastener driver 618 moves independently (both in rotation and axial position) of these components and may rotate to screw the fastener into the hole.

With continued reference to FIGS. 6A and 6B, FIG. 6C is a cross-section view of the system 600. The system 600 includes threaded pusher adaptor 610 and the lead screw adaptor 608, explained above. The motor 602 rotates the lead screw adaptor 608, which is threaded with the threaded pusher adaptor 610. Because of the pin feature 620, the threaded pusher adaptor 610 moves up and down along the pin guide 612 and does not rotate. The threaded pusher adaptor 610 moves the pusher 616 to compress the mounting assembly to a predetermined mounting force.

The fastener driver 618 does not contact the load cell 614. Since the fastener driver 618 is independent of the pusher 616, the current mounting force exerted by the pusher 616 is measured by the load cell 614 (without the force being applied by the fastener driver 618). Operations of the fastener driver 618 do not factor into the operations of the pusher 616 as controlled by the motor 602 and measured by the load cell 614.

With continued reference to FIGS. 6A-C, FIG. 6D is a diagram illustrating the system 600 transitioning from a retracted state to an extended state.

At 632, the system 600 is in the retracted state. The lead screw adaptor 608 is retracted within the threaded pusher adaptor 610. The pusher 616 is also retracted. The bottom end of the fastener driver 618 is positioned within the pusher 616. The top end of the fastener driver 618 extends in a vertical direction above the driving mechanism. In another example embodiment, the bottom end of the fastener driver 618 is extended to interface with a locking mechanism (not shown) even before transitioning to an extended state for pre-alignment, for example.

At 634, the controller (not shown) instructs the system 600 to transition to the extended state to lock with the mounting assembly and to apply a predetermined mounting force to the mounting assembly (not shown). The motor 602 drives the lead screw adaptor 608, which in turn moves the threaded pusher adaptor 610 downward exposing a portion of the lead screw adaptor 608 to the outside, as shown at 636. The pusher 616 is then extended in a downward vertical direction (in this example) i.e., toward the mounting assembly, to lock with a bushing of the mounting assembly and to exert a predetermined mounting force, as described above. For example, the pusher 616 is extended by about 50 mm.

The system 600 has a colinear driving mechanism which is particularly advantageous when multiple systems are used. By using a colinear driving mechanism, multiple driving mechanisms can be positioned close to one another.

Figure 7:
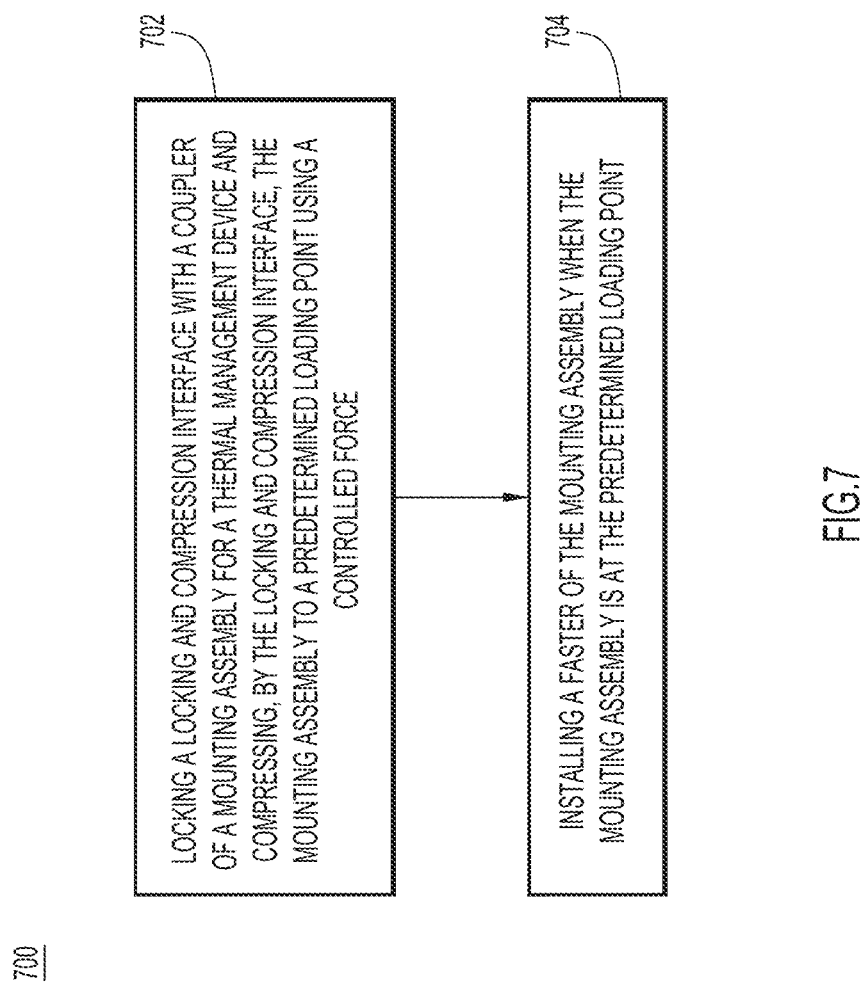
FIG. 7 is a flow chart of a method of installing a thermal management device, according to an example embodiment.

FIG. 7 is a flow chart illustrating a method 700 of installing a thermal management device, according to an example embodiment.

The method 700 involves at 702, a compression and locking interface locking with a coupler of a mounting assembly for a thermal management device and compressing the mounting assembly to a predetermined loading point using a controlled force.

The method 700 further involves at 704, installing a fastener of the mounting assembly when the mounting assembly is at the predetermined loading point.

Figure 8:
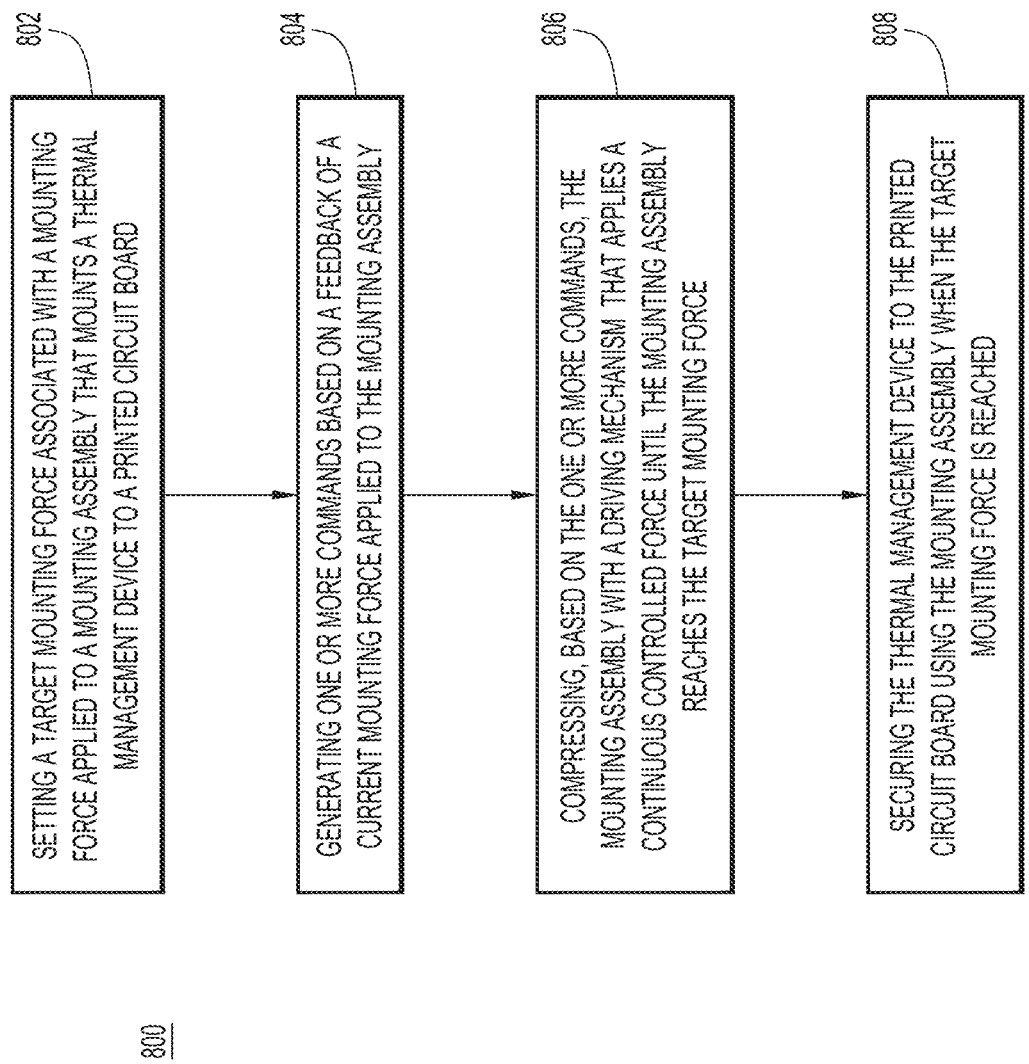
FIG. 8 is a flow chart of a method of installing a thermal management device onto a printed circuit board, according to another example embodiment.

FIG. 8 is a flow chart illustrating a method 800 of installing a thermal management device onto a printed circuit board, according to another example embodiment.

The method 800 involves at 802, a programmable controller setting a target mounting force associated with a mounting force applied to a mounting assembly that mounts a thermal management device to a printed circuit board.

The method 800 further involves at 804, the programmable controller generating one or more commands based on a feedback of a current mounting force applied to the mounting assembly.

The method 800 further involves at 806, compressing, based on the one or more commands, the mounting assembly with a driving mechanism that applies a continuous controlled force until the mounting assembly reaches the target mounting force and at 808, securing the thermal management device to the printed circuit board using the mounting assembly when the target mounting force is reached.

In one form, the operation 804 of the programmable controller generating one or more commands may include obtaining the current mounting force of the mounting assembly by a compression sensor and generating a driving command for the driving mechanism based on the current mounting force and the target mounting force.

In another form, the operation 804 of the programmable controller generating one or more commands may include obtaining the current mounting force of the mounting assembly by a compression sensor and decreasing, by the programmable controller, a speed of compressing the mounting assembly based on the current mounting force approaching the target mounting force.

According to one or more example embodiments, the mounting assembly may include a spring-loaded fastener and a coupler. The operation 806 of compressing the mounting assembly may include applying the continuous controlled force to the coupler to compress a spring of the spring-loaded fastener to the target mounting force. The operation 808 of securing the thermal management device may include attaching the thermal management device using a fastener of the spring-loaded fastener when the spring is compressed to the target mounting force.

In one example, the mounting assembly may be one of a plurality of mounting assemblies and the driving mechanism may be one of a plurality of driving mechanisms. The method 800 may further involve the programmable controller setting, for each of the plurality of mounting assemblies, the target mounting force for installing the thermal management device. The method 800 may further involve positioning the plurality of mounting assemblies onto the thermal management device to attach the thermal management device to the printed circuit board and the programmable controller generating a plurality of commands based on the feedback of a plurality of current mounting forces of the plurality of mounting assemblies. The method 800 may further involve compressing, based on the plurality of commands, the plurality of mounting assemblies using the plurality of driving mechanisms that apply the continuous controlled force until a respective mounting assembly reaches a respective one of a plurality of target mounting forces.

According to one or more example embodiments, at least one target mounting force of the plurality of target mounting forces may be different from another of the plurality of target mounting forces.

In one form, each of the plurality of mounting assemblies may include a fastener and a coupler. The method 800 may further involve the programmable controller synchronizing a process of compressing the coupler of each of the plurality of mounting assemblies with one another. The method 800 may further involve installing the fastener of each of the plurality of mounting assemblies to secure the thermal management device to the printed circuit board when the target mounting force for each of the plurality of mounting assemblies is reached.

In another form, setting the target mounting force for each of the plurality of mounting assemblies may involve individually setting the target mounting force for each of the plurality of mounting assemblies. At least one target mounting force may be different from another target mounting force.

According to one or more example embodiments, the operation 806 of compressing the mounting assembly may include locking the mounting assembly with a locking and compression interface and compressing the mounting assembly via the locking and compression interface driven by the driving mechanism.

In another example embodiment, a system is provided. The system includes a programmable controller, a mounting assembly, and a driving mechanism. The programmable controller is configured to generate one or more commands to control an installation of a thermal management device. The mounting assembly is configured to fasten the thermal management device to another component of a device at a target mounting force. The driving assembly is configured to drive the mounting assembly to the target mounting force, based on the one or more commands, using a predetermined compression force.

In one form, the driving assembly is an actuator assembly that may include a rigid fixture and a linear actuator attached to the rigid fixture. The linear actuator may be configured to provide the predetermined compression force to drive the mounting assembly to the target mounting force.

In another form, the system may further include a compression interface connected to the linear actuator and configured to lock with and compress the mounting assembly.

According to one or more example embodiments, the system may further include a detector configured to continuously detect a current mounting force of the mounting assembly and provide a measure of the current mounting force to the programmable controller. The programmable controller may generate the one or more commands based on the measure of the current mounting force and the target mounting force. The compression interface may be connected to the linear actuator.

In another instance, the driving assembly may be an actuator assembly that is offset from the mounting assembly. The actuator assembly may include a fixture adaptor and a linear actuator attached to the fixture adaptor and configured to provide the predetermined compression force to drive the mounting assembly to the target mounting force.

According to one or more example embodiments, the system may further include a spacer tube and a thrust plate that offsets the linear actuator from the mounting assembly and connects to the spacer tube. The system may further include a compression interface colinearly connected to the spacer tube and configured to lock with and compress the mounting assembly.

In another instance, the driving assembly may be colinear with the mounting assembly and may include a motor configured to provide the predetermined compression force to drive the mounting assembly to the target mounting force. The driving assembly may further include a fixture plate configured to connect the motor to provide the predetermined compression force to drive the mounting assembly to the target mounting force.

In another example embodiment, a system is provided. The system includes a mounting assembly for a thermal management device. The mounting assembly includes a fastener and a coupler. The system further includes a compression and locking interface configured to lock with the coupler and compress the mounting assembly to a predetermined loading point using a controlled force such that the fastener is installed when the mounting assembly is at the predetermined loading point.

In one form, the fastener may be spring-loaded. A spring of the fastener may compress to the predetermined loading point while being locked with the coupler prior to the fastener being secured therein (by screwing a nut thereon).

According to one or more example embodiments, the fastener may be configured to be inserted through a first installation hole of the thermal management device and/or a second hole of a printed circuit board to attach the thermal management device to the printed circuit board.

In one instance, the coupler may be an annular bushing that houses the spring of the fastener and has an external annular rim. The compression and locking interface may have at least one internal rail that is configured to latch to a portion of the external annular rim.

In another form, the compression and locking interface may include a pusher configured to lock with the coupler and compress the mounting assembly at the controlled force and a driver. The driver may be nested inside the pusher and may be configured to install the fastener when the predetermined loading point is reached.

According to one or more example embodiments, the driver may be integrally formed with the pusher and freely rotate within the pusher.

In another instance, the pusher may be a hollow cylinder configured to provide a vertical controlled mounting force and may be positioned collinearly to the fastener.

Figure 9:
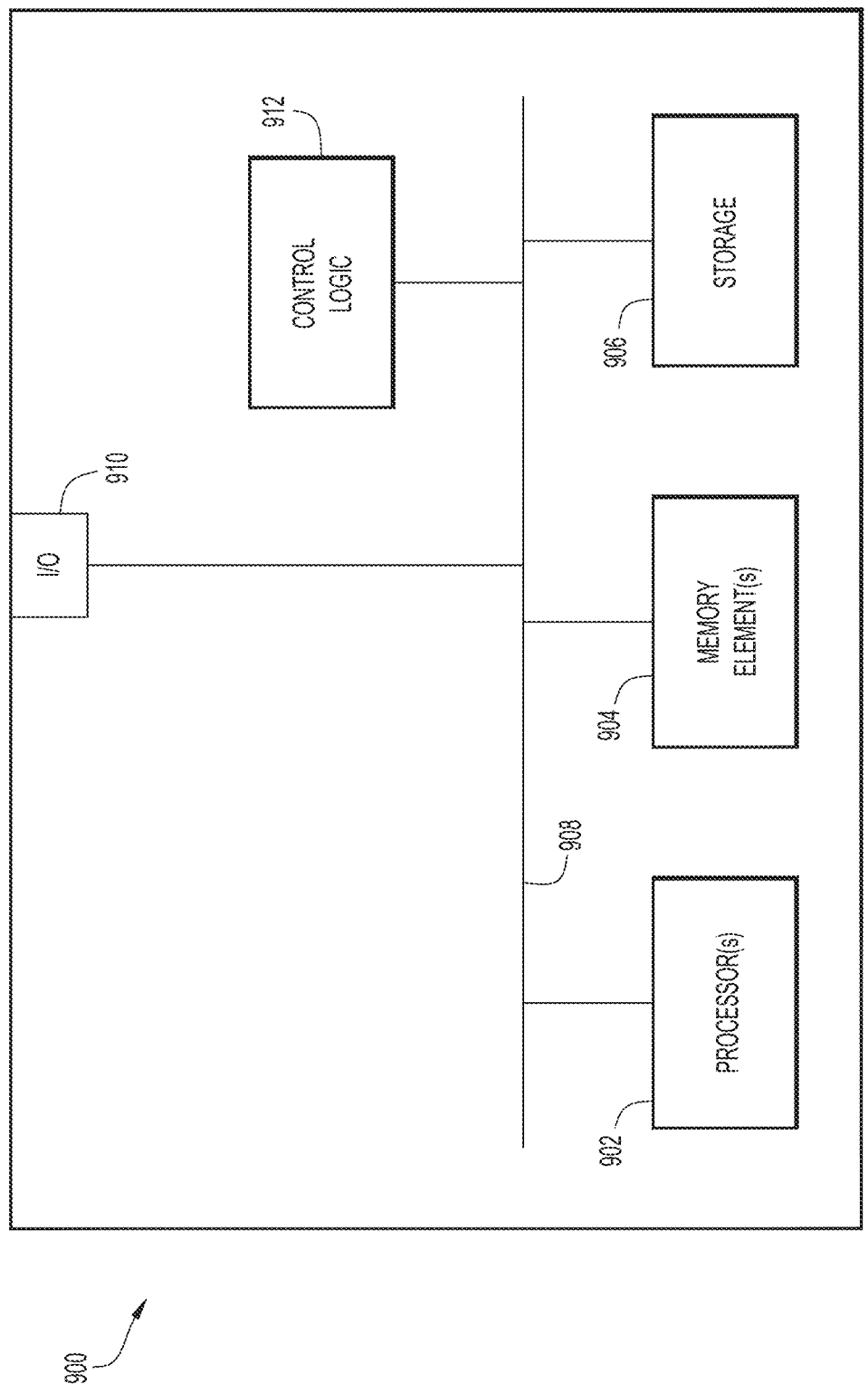
FIG. 9 is a hardware block diagram of a programmable controller that may perform functions associated with any combination of operations in connection with the techniques depicted and described in FIGS. 1-8, according to various example embodiments.

FIG. 9 is a hardware block diagram of a programmable controller 900 that may perform functions associated with any combination of operations in connection with the techniques depicted in FIGS. 1-8, according to various example embodiments, including, but not limited to, operations of the programmable controller 420 of FIG. 4A and/or operations of the programmable controller 480 of FIG. 4B. It should be appreciated that FIG. 9 provides only an illustration of one example embodiment and does not imply any limitations with regard to the environments in which different example embodiments may be implemented. Many modifications to the depicted environment may be made.

In at least one embodiment, programmable controller 900 may include one or more processor(s) 902, one or more memory element(s) 904, storage 906, a bus 908, one or more I/O interface(s) 910, and control logic 912. In various embodiments, instructions associated with logic for programmable controller 900 can overlap in any manner and are not limited to the specific allocation of instructions and/or operations described herein.

In at least one embodiment, processor(s) 902 is/are at least one hardware processor configured to execute various tasks, operations and/or functions for programmable controller 900 as described herein according to software and/or instructions configured for programmable controller 900. Processor(s) 902 (e.g., a hardware processor) can execute any type of instructions associated with data to achieve the operations detailed herein. In one example, processor(s) 902 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, one or more memory element(s) 904 and/or storage 906 is/are configured to store data, information, software, and/or instructions associated with programmable controller 900, and/or logic configured for memory element(s) 904 and/or storage 906. For example, any logic described herein (e.g., control logic 912) can, in various embodiments, be stored for programmable controller 900 using any combination of memory element(s) 904 and/or storage 906. Note that in some embodiments, storage 906 can be consolidated with one or more memory elements 904 (or vice versa), or can overlap/exist in any other suitable manner. In one or more example embodiments, process data is also stored in the one or more memory elements 904 for later evaluation and/or process optimization.

In at least one embodiment, bus 908 can be configured as an interface that enables one or more elements of programmable controller 900 to communicate in order to exchange information and/or data. Bus 908 can be implemented with any architecture designed for passing control, data and/or information between processors, memory elements/storage, peripheral devices, and/or any other hardware and/or software components that may be configured for programmable controller 900. In at least one embodiment, bus 908 may be implemented as a fast kernel-hosted interconnect, potentially using shared memory between processes (e.g., logic), which can enable efficient communication paths between the processes.

I/O interface(s) 910 allow for input and output of data and/or information with other entities that may be connected to programmable controller 900. For example, I/O interface(s) 910 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards.

In various embodiments, control logic 912 can include instructions that, when executed, cause processor(s) 902 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 912) may be identified based upon the application(s) for which they are implemented in a specific embodiment. However, it should be appreciated that any particular program nomenclature herein is used merely for convenience, and thus the embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, the storage 906 and/or memory elements(s) 904 can store data, software, code, instructions (e.g., processor instructions), logic, parameters, combinations thereof, and/or the like used for operations described herein. This includes the storage 906 and/or memory elements(s) 904 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

To the extent that embodiments presented herein relate to the storage of data, the embodiments may employ any number of any conventional or other databases, data stores or storage structures (e.g., files, databases, data structures, data, or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

In one example embodiment, one or more non-transitory computer readable storage media encoded with instructions are provided. When the media is executed by a programmable controller, the instructions cause the programmable controller to execute a method 800 in FIG. 8 and/or perform operations of the programmable controller 420 in FIG. 4A or the programmable controller 480 in FIG. 4B.

In yet another example embodiment, a system, an apparatus, or an assembly is provided that includes the components and operations explained above with reference to FIGS. 1-9.

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as 'above', 'below', 'upper', 'lower', 'top', 'bottom', or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc. the phrase 'between X and Y' represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present embodiments to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure are described with more particular reference to the accompanying figures above.

Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A system comprising:
   a mounting assembly for a thermal management device, the mounting assembly including a fastener and a coupler; and
   a compression and locking interface that comprises a main body with rails that define an aperture and that locks with the coupler while compressing the mounting assembly to a predetermined loading point by a controlled force such that the fastener is installed when the mounting assembly is at the predetermined loading point.

2. The system of claim 1, wherein the fastener is spring-loaded, and wherein a spring of the fastener compresses to the predetermined loading point while locked with the coupler prior to the fastener being secured therein.

3. The system of claim 2, wherein the fastener is inserted through at least one of a first installation hole of the thermal management device or a second hole of a printed circuit board to attach the thermal management device to the printed circuit board.

4. The system of claim 2, wherein the coupler is an annular bushing that houses the spring of the fastener and has an external annular rim, and wherein the compression and locking interface has at least one internal rail that is configured to latch to a portion of the external annular rim.

5. The system of claim 1, wherein the compression and locking interface retracts from the mounting assembly after the fastener is installed.

6. The system of claim 1, further comprising:
   a driving mechanism connected to the compression and locking interface and is configured to drive the compression and locking interface, at the controlled force.

7. The system of claim 6, wherein the driving mechanism is connected to the compression and locking interface and continuously drives the compression and locking interface at the controlled force until a target mounting force is reached.

8. A system comprising:
   a mounting assembly for a thermal management device, the mounting assembly including a fastener and a coupler; and
   a compression and locking interface that locks with the coupler and compresses the mounting assembly to a predetermined loading point such that the fastener is installed when the mounting assembly is at the predetermined loading point, wherein the compression and locking interface comprises:
   a pusher configured to lock with the coupler and compress the mounting assembly based on a controlled force; and
   a driver, nested inside the pusher, configured to install the fastener when the predetermined loading point is reached.

9. The system of claim 8, wherein the driver is integrally formed with the pusher and freely rotates within the pusher.

10. The system of claim 8, wherein the pusher is a hollow cylinder configured to provide a vertical controlled mounting force and is positioned collinearly to the fastener.

11. The system of claim 8, wherein the fastener is spring-loaded with a spring, and wherein the spring of the fastener compresses to the predetermined loading point while the pusher is locked with the coupler prior to the fastener being secured therein.

12. The system of claim 8, wherein the fastener is configured to be inserted through at least one of a first installation hole of the thermal management device or a second hole of a printed circuit board to attach the thermal management device to the printed circuit board.

13. The system of claim 8, wherein the mounting assembly is embedded into a cavity in the thermal management device and the pusher is configured to fit into the cavity to lock with the coupler.

14. The system of claim 8, wherein the coupler is an annular bushing that houses a spring for the fastener and the pusher includes at least one internal rail that latches to a portion of an external annular rim of the coupler from above.

15. A method for securing a thermal management device onto a printed circuit board using a system, the method comprising:
   providing the system having a mounting assembly that includes a fastener and a coupler and a compression and locking interface that includes a main body with rails that define an aperture;

locking, by the compression and locking interface, with the coupler of the mounting assembly for the thermal management device;

compressing, by the compression and locking interface, the mounting assembly to a predetermined loading point based on a controlled force; and installing the fastener of the mounting assembly into an installation hole in the thermal management device when the mounting assembly is at the predetermined loading point to secure the thermal management device onto the printed circuit board.

16. The method of claim 15, wherein the compression and locking interface compresses the mounting assembly after locking with the coupler.

17. The method of claim 15, wherein the fastener is spring-loaded, and compressing the mounting assembly includes:

compressing the mounting assembly until a spring of the fastener compresses to the predetermined loading point while being locked with the coupler.

18. The method of claim 17, wherein installing the fastener of the mounting assembly includes:

inserting the fastener through the installation hole of the thermal management device and through another hole of the printed circuit board to attach the thermal management device to the printed circuit board.

19. The method of claim 17, wherein the coupler is an annular bushing that houses the spring of the fastener and has an external annular rim, and wherein locking with the coupler of the mounting assembly includes:

latching at least one internal rail of the compression and locking interface to a portion of the external annular rim.

20. The method of claim 15, wherein locking with the coupler of the mounting assembly includes locking, by a pusher of the compression and locking interface, with the coupler, wherein installing the fastener includes installing the fastener by a driver of the compression and locking interface when the predetermined loading point is reached, the driver being nested inside the pusher.

21. The method of claim 20, wherein installing the fastener further includes:

freely rotating the driver within the pusher to install the fastener.

22. The method of claim 20, wherein the pusher is a hollow cylinder positioned collinearly to the fastener, and compressing the mounting assembly includes:

providing a vertical controlled mounting force to the mounting assembly.

23. The method of claim 20, wherein the mounting assembly is embedded into a cavity in the thermal management device, and the method further comprising:

inserting the pusher into the cavity in the thermal management device to lock with the coupler.

* * * * *